(12) United States Patent
Fukunaga

(10) Patent No.: US 7,495,528 B2
(45) Date of Patent: Feb. 24, 2009

(54) TRIPLEXER CIRCUIT

(75) Inventor: Tatsuya Fukunaga, Tokyo (JP)

(73) Assignee: TDK Corporation, Tokyo (JP)

( * ) Notice: Subject to any disclaimer, the term of this patent is extended or adjusted under 35 U.S.C. 154(b) by 385 days.

(21) Appl. No.: 11/436,024

(22) Filed: May 18, 2006

(65) Prior Publication Data

US 2006/0268811 A1    Nov. 30, 2006

(30) Foreign Application Priority Data

May 27, 2005   (JP) ............................. 2005-156278

(51) Int. Cl.
*H01P 5/12*   (2006.01)
*H03H 7/46*   (2006.01)

(52) U.S. Cl. ................. 333/132; 333/126; 333/129

(58) Field of Classification Search ................ 333/126, 333/129, 132
See application file for complete search history.

(56) References Cited

U.S. PATENT DOCUMENTS 7,126,440 B2 *   10/2006   Bradley et al. ............... 333/133

FOREIGN PATENT DOCUMENTS

JP   A 2003-198309   7/2003

* cited by examiner

*Primary Examiner*—Benny Lee
*Assistant Examiner*—Kimberly E Glenn
(74) *Attorney, Agent, or Firm*—Oliff & Berridge, PLC

(57) ABSTRACT

The present invention provides a triplexer circuit obtaining an impedance matching in each of frequency bands with a simple configuration and separating a signal excellently. Three filters are connected in parallel with each other and, for signals in a pass frequency band of one of the filters, the other two filters form a parallel resonant circuit. In this case, the total impedance of the whole parallel resonant circuit becomes infinite ($\infty$) and the other two filters can be made open to the pass frequency band of the one filter. With the simple configuration in which the three filters are connected in parallel with each other, an impedance matching is obtained in each of the frequency bands, and excellent signal separation can be performed.

3 Claims, 14 Drawing Sheets

TRIPLEXER CIRCUIT

CROSS REFERENCE TO RELATED APPLICATIONS

The present invention contains subject matter related to Japanese Patent Application JP 2005-156278 filed in the Japanese Patent Office on May 27, 2005, the entire contents of which being incorporated herein by reference.

BACKGROUND OF THE INVENTION

1. Field of the Invention

The present invention relates to a triplexer circuit for separating an input signal into signals of three frequency bands which are different from each other.

2. Description of the Related Art

Hitherto, there is a duplexer that receives signals of two different frequency bands by a single antenna and separates the signals into the different bands. Such a duplexer is realized by connecting first and second filters 101 and 102 for passing only signals in their bands in parallel with each other as shown in FIG. 20.

In recent years, a triplexer for separating signals of three frequency bands which are different from each other into their bands has been also proposed. In Japanese Patent Laid-Open (JP-A) No. 2003-198309, a triplexer configured by combining filters in multiple stages has been proposed. The triplexer described in JP-A-2003-198309 has a first filter circuit part that passes a signal of a first frequency band and a lowpass filter circuit part connected to the first filter circuit part in parallel with each other and passing a signal of a frequency band lower than the first frequency band. At a post stage of the lowpass filter circuit part, a second filter circuit part that passes a signal of a second frequency band and a third filter circuit part that passes a signal of a third frequency band are connected in parallel.

SUMMARY OF THE INVENTION

In the case of constructing a duplexer, only by simply and singly connecting filters 101 and 102 in parallel, an impedance matching cannot be obtained and a problem occurs such that sufficient characteristics cannot be obtained. Since another filter is connected to one filter, as compared with the case of using only one filter, an input impedance shifts.

A method is known in which, as shown in FIG. 21, transmission lines 111 and 112 are connected at the front stage of the first and second filters 101 and 102, respectively, to add an electric length in order to avoid the problem. In this case, an electric length is added so that, for the pass frequency of one filter, the other one filter becomes open. As an example, the parameters of the transmission line 112 to be added to the second filter 102 will be described by using a Smith chart shown in FIG. 22. The center of the Smith chart corresponds to a reference impedance (an impedance on the signal source side (a load on the input side)) $Z_0$, the impedance at the left end is 0 (short-circuited), and the impedance at the right end is ∞ (open). When an impedance is on the outer periphery, the reflection coefficient is 1. It is now assumed that an input impedance $Z_2$ of the second filter 102 is at a point on the shown outer periphery in the pass frequency of the first filter 101. When the whole configuration in which the transmission line 112 is connected to the second filter 102 in series is regarded as a filter, the pass characteristic (amplitude) of the filter is unchanged but only the phase of the reflection coefficient changes. In this case, when the phase of the reflection coefficient obtained by the transmission line 111 is $\theta_1$ and that of the reflection coefficient obtained by the transmission line 112 is $\theta_2$, the input impedance $Z_2$ moves clockwise only by an amount of $2\theta_2$ on the Smith chart. At the pass frequency of the first filter 101, when the input impedance $Z_2$ of the second filter 102 becomes ∞, an impedance matching is obtained. Consequently, it is sufficient to add an electric length to obtain such a phase as the transmission line 112.

On the other hand, in the case of using the configuration described in JP-A No. 2003-198309 for a triplexer, total four filter circuit parts are provided to separate signals in three frequency bands, so that there is a problem such that the circuit is complicated. A configuration is considered in which three filter circuit parts are connected in parallel and an electric length is added in a manner similar to the configuration of the duplexer. In the case of a duplexer, the condition is simply to add an electric length so that one filter becomes open for the pass frequency of another filter. However, in the case of a triplexer, the number of filters to be open is two, so that the conditions of the electric length cannot be simply determined unlike a duplexer. Conventionally, a method of determining a matching condition with respect to a triplexer having a configuration in which three filter circuit parts are connected in parallel has not been established.

In view of the drawback, it is desirable to provide a triplexer circuit obtaining an impedance matching in each of frequency bands with a simple configuration and achieving excellent signal separation.

A triplexer circuit of an embodiment of the invention separates an input signal into signals in three frequency bands which are different from each other, and includes: a first filter module that passes signals in a first frequency band; a second filter module that passes signals in a second frequency band; and a third filter module that passes signals in a third frequency band. The first, second, and third filter modules are connected in parallel with each other. Further, the second and third filter modules form a parallel resonant circuit for signals in the first frequency band, the first and third filter modules form a parallel resonant circuit for signals in the second frequency band, and the first and second filter modules form a parallel resonant circuit for signals in the third frequency band.

In the triplexer circuit according to an embodiment of the invention, for signals in the pass frequency band of one filter module, the other two filter modules form a parallel resonant circuit. In this case, the total impedance of the whole parallel resonant circuit becomes ∞ and, for the pass frequency band of one filter module, the other two filter modules as a whole become open. Therefore, in the pass frequency band of one filter module, the other two filter modules do not exert an influence on the filter characteristic of the one filter module, so that excellent signal separation is performed.

In the triplexer circuit according to an embodiment of the invention, when a pass frequency of the first filter module is f1, a pass frequency of the second filter module is f2, and a pass frequency of the third filter module is f3, preferably, phase components of reflection coefficients at the pass frequencies f1, f2, and f3 in the filter modules satisfy the following conditions:

$\theta_2(f1) + \theta_3(f1) = 2n_1\pi$ and $\theta_2(f1) \neq (2p_1-1)\pi,\ \theta_3(f1) \neq (2m_1-1)\pi$ \hfill (A1)

$\theta_3(f2) + \theta_1(f2) = 2n_2\pi$ and $\theta_3(f2) \neq (2p_2-1)\pi,\ \theta_1(f2) \neq (2m_2-1)\pi$ \hfill (A2)

$\theta_1(f3)+\theta_2(f3)=2n_3\pi$ and $\theta_1(f3)\neq(2p_3-1)\pi, \theta_2(f3)\neq(2m_3-1)\pi$ (A3)

where $\theta_i(f1)$: phase of a reflection coefficient at the frequency f1 in the i-th (=1, 2, 3) filter module $\theta_i(f2)$: phase of a reflection coefficient at the frequency f2 in the i-th filter module $\theta_i(f3)$: phase of a reflection coefficient at the frequency f3 in the i-th filter module $n_1, n_2, n_3, m_1, m_2, m_3, p_1, p_2, p_3$: arbitrary integers By satisfying the conditions, particularly, in the case of constructing each of the filter modules by a single filter, the filters do not interfere each other and are independent of each other. Consequently, each of the filters can be designed independently.

In the triplexer circuit according to an embodiment of the invention, each of the filter modules may include a filter and a phase shifter provided at a front stage of the filter.

In the configuration, phase adjustment can be performed in the phase shifter. Consequently, for example, as compared with the case where each filter module is constructed only by a filter, an impedance matching can be easily adjusted.

In the case where each of the filter modules includes a filter and a phase shifter provided at a front stage of the filter, when a pass frequency of a filter in the first filter module is f1, a pass frequency of a filter in the second filter module is f2, and a pass frequency of a filter in the third filter module is f3, preferably, phase components of reflection coefficients at the pass frequencies f1, f2, and f3 in the filter modules satisfy the following conditions:

$\theta_2(f1)+\theta_3(f1)=2n_1\pi+2[\alpha_2(f1)+\alpha_3(f1)]$ and $\theta_2(f1)\neq(2p_1-1)\pi+2\alpha_2(f1),$ $\theta_3(f1)\neq(2m_1-1)\pi+2\alpha_3(f1)$ (B1)

$\theta_3(f2)+\theta_1(f2)=2n_2\pi+2[\alpha_3(f2)+\alpha_1(f2)]$ and $\theta_3(f2)\neq(2p_2-1)\pi+2\alpha_3(f2),$ $\theta_1(f2)\neq(2m_2-1)\pi+2\alpha_1(f2)$ (B2)

$\theta_1(f3)+\theta_2(f3)=2n_3\pi+2[\alpha_1(f3)+\alpha_2(f3)]$ and $\theta_1(f3)\neq(2p_3-1)\pi+2\alpha_1(f3),$ $\theta_2(f3)\neq(2m_3-1)\pi+2\alpha_2(f3)$ (B3)

where $\theta_i(f1)$: phase of a reflection coefficient at the frequency f1 in the filter of the i-th (=1, 2, 3) filter module $\theta_i(f2)$: phase of a reflection coefficient at the frequency f2 in the filter of the i-th filter module $\theta_i(f3)$: phase of a reflection coefficient at the frequency f3 in the filter of the i-th filter module $\alpha_i(f1)$: phase characteristic at the frequency f1 in the phase shifter of the i-th filter module $\alpha_i(f2)$: phase characteristic at the frequency f2 in the phase shifter of the i-th filter module $\alpha_i(f3)$: phase characteristic at the frequency f3 in the phase shifter of the i-th filter module $n_1, n_2, n_3, m_1, m_2, m_3, p_1, p_2, p_3$: arbitrary integers By satisfying the conditions, phase adjustment is properly performed by the phase shifters so as to obtain an impedance matching.

Even if the values of $\alpha_i(f1), \alpha_i(f2)$, and $\alpha_i(f3)$ have an error of about, for example, ±10% from the values satisfying the conditional expressions, there is no problem in practical use.

In the case where each of the filter modules includes a filter and a phase shifter provided at the front stage of the filter and the phase shifter is a transmission line, when a pass frequency of a filter in the first filter module is f1, a pass frequency of a filter in the second filter module is f2, and a pass frequency of a filter in the third filter module is f3, preferably, physical lengths $l_1, l_2$, and $l_3$ of transmission lines in the filter modules satisfy the following conditions:

$$l_1 = \frac{c}{2\pi\sqrt{\varepsilon_{r1}\mu_{r1}}}\left\{\begin{array}{c}-\frac{\theta_2(f1)+\theta_3(f1)-2n_1\pi}{4f1}+\\ \frac{\theta_3(f2)+\theta_1(f2)-2n_2\pi}{4f2}+\\ \frac{\theta_1(f3)+\theta_2(f3)-2n_3\pi}{4f3}\end{array}\right\}$$ (C1)

$$l_1 \neq \frac{c\{\theta_1(f2)-(2p_1-1)\pi\}}{4\pi\sqrt{\varepsilon_{r1}\mu_{r1}}\,f2}, \; l_1 \neq \frac{c\{\theta_1(f3)-(2m_1-1)\pi\}}{4\pi\sqrt{\varepsilon_{r1}\mu_{r1}}\,f3}$$

$$l_2 = \frac{c}{2\pi\sqrt{\varepsilon_{r2}\mu_{r2}}}\left\{\begin{array}{c}\frac{\theta_2(f1)+\theta_3(f1)-2n_1\pi}{4f1}-\\ \frac{\theta_3(f2)+\theta_1(f2)-2n_2\pi}{4f2}+\\ \frac{\theta_1(f3)+\theta_2(f3)-2n_3\pi}{4f3}\end{array}\right\}$$ (C2)

$$l_2 \neq \frac{c\{\theta_1(f1)-(2p_2-1)\pi\}}{4\pi\sqrt{\varepsilon_{r2}\mu_{r2}}\,f1}, \; l_2 \neq \frac{c\{\theta_1(f3)-(2m_2-1)\pi\}}{4\pi\sqrt{\varepsilon_{r2}\mu_{r2}}\,f3}$$

$$l_3 = \frac{c}{2\pi\sqrt{\varepsilon_{r3}\mu_{r3}}}\left\{\begin{array}{c}\frac{\theta_2(f1)+\theta_3(f1)-2n_1\pi}{4f1}+\\ \frac{\theta_3(f2)+\theta_1(f2)-2n_2\pi}{4f2}-\\ \frac{\theta_1(f3)+\theta_2(f3)-2n_3\pi}{4f3}\end{array}\right\}$$ (C3)

$$l_3 \neq \frac{c\{\theta_1(f1)-(2p_3-1)\pi\}}{4\pi\sqrt{\varepsilon_{r3}\mu_{r3}}\,f2}, \; l_3 \neq \frac{c\{\theta_1(f2)-(2m_3-1)\pi\}}{4\pi\sqrt{\varepsilon_{r3}\mu_{r3}}\,f3}$$

where $\theta_i(f1)$: phase of a reflection coefficient at the frequency f1 in the filter of the i-th (=1, 2, 3) filter module $\theta_i(f2)$: phase of a reflection coefficient at the frequency f2 in the filter of the i-th filter module $\theta_i(f3)$: phase of a reflection coefficient at the frequency f3 in the filter of the i-th filter module c: light velocity $\varepsilon_{ri}$: relative permittivity of a transmission line of the i-th filter module $\mu_{ri}$: relative magnetic permeability of the transmission line of the i-th filter module $n_1, n_2, n_3, m_1, m_2, m_3, p_1, p_2, p_3$: arbitrary integers satisfying $l_1, l_2$, and $l_3 \geq 0$ (where $l_1, l_2$, and $l_3$ are not simultaneously zero)

By satisfying the conditions, phase adjustment is properly performed by the transmission lines as phase shifters so as to obtain an impedance matching.

Even if the values of $l_1, l_2$, and $l_3$ have an error of about, for example, ±10% from the values of the expressions, there is no problem in practical use.

In the triplexer circuit according to an embodiment of the invention, three filter modules are connected in parallel with each other and, for signals in a pass frequency band of one of the filters, the other two filters form a parallel resonant circuit. Therefore, the total impedance of the whole parallel resonant circuit becomes infinite (∞) and the other two filters can be made open to the pass frequency band of the one filter. With the simple configuration in which the three filters are connected in parallel with each other, an impedance matching is obtained in each of the frequency bands, and excellent signal separation can be performed.

Other and further objects, features and advantages of the invention will appear more fully from the following description.

DETAILED DESCRIPTION OF THE PREFERRED EMBODIMENTS

Embodiments of the present invention will be described in detail hereinbelow with reference to the drawings.

First Embodiment

Figure 1:
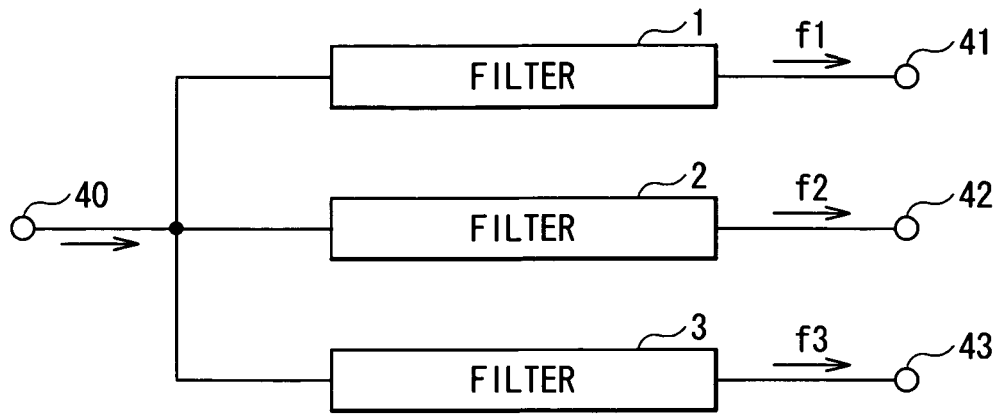
FIG. 1 is a circuit diagram showing the configuration of a triplexer circuit according to a first embodiment of the invention.

First, a triplexer circuit according to a first embodiment of the invention will be described. FIG. 1 shows an example of the configuration of a triplexer circuit according to the first embodiment. The triplexer circuit separates an input signal into signals in three frequency bands which are different from each other and is configured by connecting three filter modules in parallel with each other. Each of the filter modules is constructed by a single filter. That is, the triplexer circuit has a first filter 1 as the first filter module, a second filter 2 as the second filter module, and a third filter 3 as the third filter module. The input sides of the first, second, and third filters 1, 2, and 3 are connected to a common input port 40. The output side of the first filter 1 is connected to a first output port 41, the output side of the second filter 2 is connected to a second output port 42, and the output side of the third filter 3 is connected to a third output port 43. The structure of each of the filters is not particularly limited. For example, a laminated filter or a dielectric filter can be used.

Figure 2:
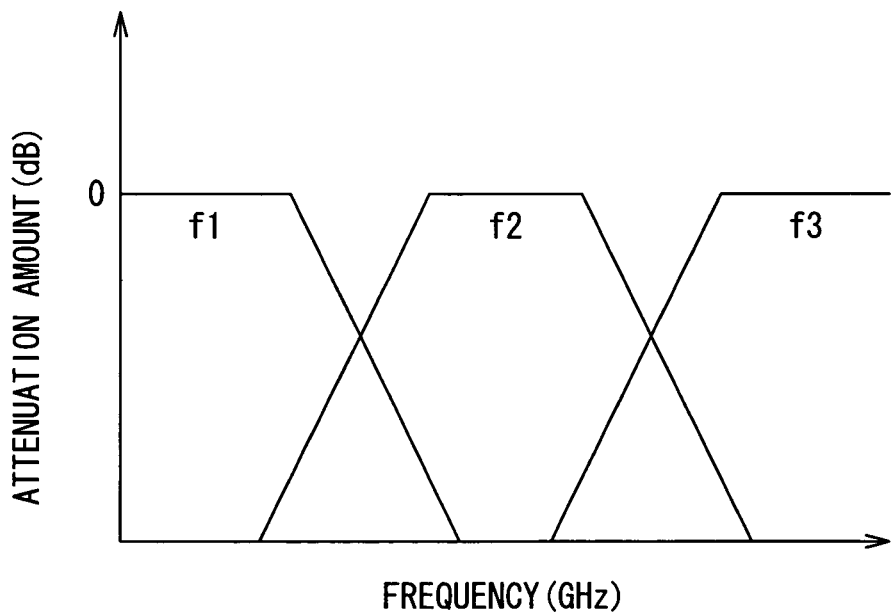
FIG. 2 is a diagram illustrating an example of a pass characteristic of the triplexer circuit of FIG. 1.

The first, second, and third filters 1, 2, and 3 pass signals in frequency bands different from each other. FIG. 2 shows an example of the pass characteristics of the filters. The horizontal axis indicates frequency (GHz), and the vertical axis indicates an attenuation amount (dB). As shown in FIG. 2, for example, the first filter 1 is a lowpass filter for passing signals in a first frequency band f1, the second filter 2 is a bandpass filter for passing signals in a second frequency band f2, and the third filter 3 is a highpass filter for passing signals in a third frequency band f3.

The triplexer circuit is constructed so that the second and third filters 2 and 3 form a parallel resonant circuit for signals in the first frequency band f1, the first and third filters 1 and 3 form a parallel resonant circuit for signals in the second frequency band f2, and the first and second filters 1 and 2 form a parallel resonant circuit for signals in the third frequency band f3.

The triplexer circuit is constructed so that phase components of reflection coefficients at the pass frequencies f1, f2, and f3 in the filters satisfy the following conditions.

$\theta_2(f1)+\theta_3(f1)=2n_1\pi$ and $\theta_2(f1) \neq (2p_1-1)\pi, \theta_3(f1) \neq (2m_1-1)\pi$ (A1)

$\theta_3(f2)+\theta_1(f2)=2n_2\pi$ and $\theta_3(f2) \neq (2p_2-1)\pi, \theta_1(f2) \neq (2m_2-1)\pi$ (A2)

$\theta_1(f3)+\theta_2(f3)=2n_3\pi$ and $\theta_1(f3) \neq (2p_3-1)\pi, \theta_2(f3) \neq (2m_3-1)\pi$ (A3)

where $\theta_i(f1)$: phase of a reflection coefficient at the frequency f1 in the i-th (=1, 2, 3) filter $\theta_i(f2)$: phase of a reflection coefficient at the frequency f2 in the i-th filter $\theta_i(f3)$: phase of a reflection coefficient at the frequency f3 in the i-th filter $n_1, n_2, n_3, m_1, m_2, m_3, p_1, p_2, p_3$: arbitrary integers Next, the meaning of the conditional expressions and the action of the triplexer will be described.

In the triplexer circuit, for a signal in the pass frequency band of one filter, the other two filters form a parallel resonant circuit. In this case, the total impedance of the whole parallel resonant circuit becomes infinite (∞) and, for the pass frequency band of one filter, the other two filters as a whole become an open state. Therefore, in the pass frequency band of one filter, the other two filters do not exert an influence on the filter characteristics of the one filter, so that excellent signal separation is performed.

Figure 3:
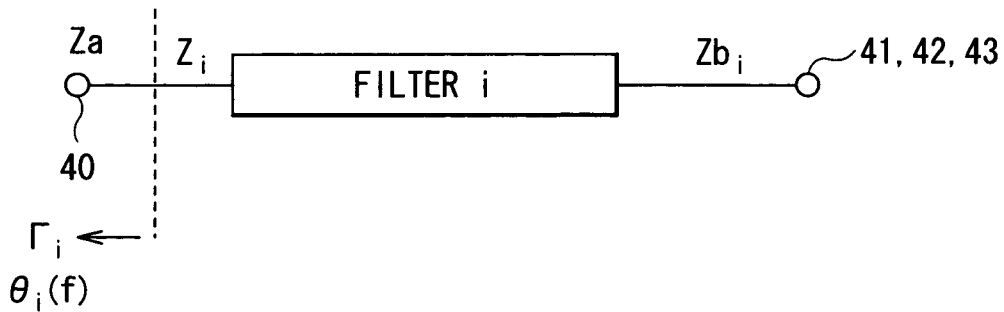
FIG. 3 is a diagram illustrating the operation of the triplexer circuit according to the first embodiment of the invention.
Figure 4:
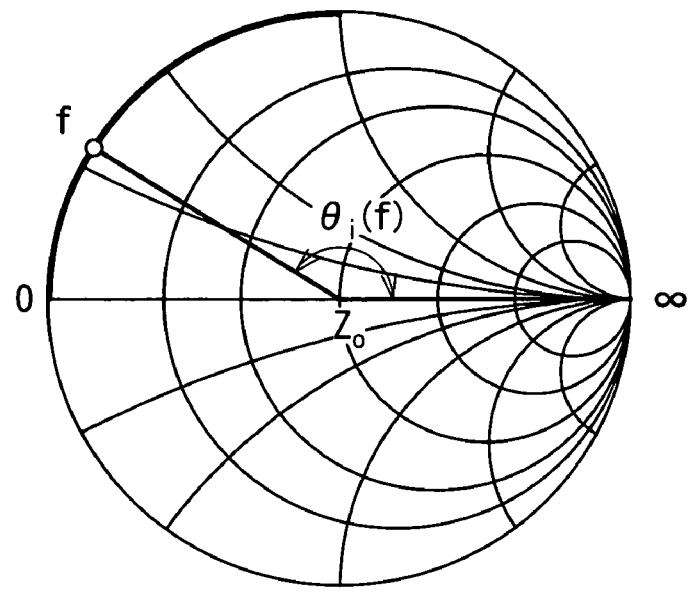
FIG. 4 is a Smith chart illustrating the phase of a reflection coefficient at frequency "f".

The parameters of the single i-th filter are set as follows. As shown in FIG. 3, the impedance of the input port 40 (the impedance on the signal source side) is set as $Za$, the input impedance of the i-th filter seen from the input port 40 is set as $Z_i$, and the impedance of the output ports (41, 42, and 43) of the i-th filter (load on the output source side) is set as $Zb_i$. The reflection coefficient of the i-th filter seen from the input port 40 is set as $\Gamma_i$, and the phase of the reflection coefficient $\Gamma_i$ is set as $\theta_i$. As shown in the Smith chart of FIG. 4, the phase of the reflection coefficient $\Gamma_i$ at the frequency f is set as $\theta_i(f)$.

The input impedance $Z_i$ is expressed by the definition expression of the reflection coefficient.

$$Z_i = \frac{1+\Gamma_i}{1-\Gamma_i} Za \qquad \text{Expression 1}$$

When it is assumed that attenuation is sufficiently obtained in the i-th filter at the pass frequencies of the other two filters, the reflection coefficient $\Gamma_i$ can be approximated to 1. Consequently, the reflection coefficient $\Gamma_i$ is expressed as follows.

$\Gamma_i \approx \exp(j\theta_i)$

Therefore, the input impedance $Z_i$ is expressed as follows.

$$Z_i = \frac{1+e^{j\theta_i}}{1-e^{j\theta_i}} \qquad \text{Expression 2}$$

$$Za = -\frac{e^{j\frac{\theta_i}{2}}+e^{-j\frac{\theta_i}{2}}}{e^{j\frac{\theta_i}{2}}-e^{-j\frac{\theta_i}{2}}}$$

$$Za = -\frac{2\cos\theta_i}{2j\sin\frac{\theta_i}{2}}$$

$$Za = jZa\cot\frac{\theta_i}{2}$$

Figure 5:
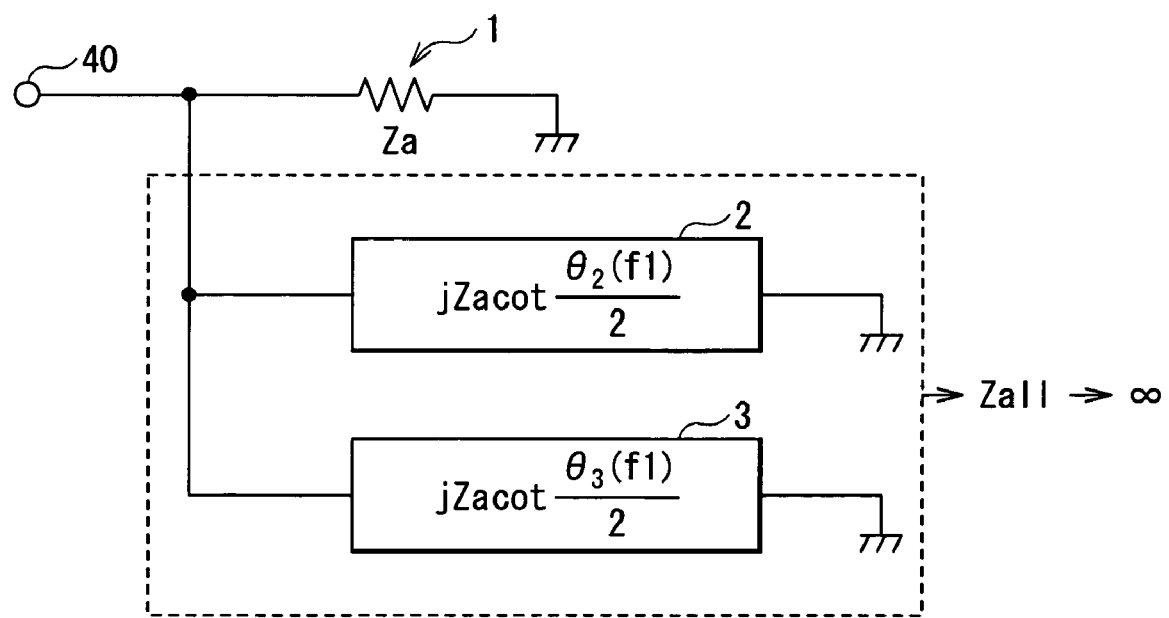
FIG. 5 is a diagram showing the correlation of impedances when the pass frequency is f1 in the triplexer circuit of FIG. 1.

From the expression 2, the correlation of impedances at the pass frequency f1 of the first filter 1 in the triplexer circuit is as shown in FIG. 5. Since the correlation is the correlation of the impedances at the pass frequency f1, $\theta_i(f)$ is set as $\theta_i(f1)$. When the total impedance of the second and third filters 2 and 3 connecting to the first filter 1 is set as $Z_{all}$ at the pass frequency f1, the following equation is obtained.

$$1/Z_{a11} = 1/Z_2 + Z_3 \qquad \text{Expression 3}$$

$$= \frac{1}{jZa}\left\{\tan\frac{\theta_2(f1)}{2}+\tan\frac{\theta_3(f1)}{2}\right\}$$

$$= \frac{1}{jZa}\left[\frac{\sin\left\{\frac{\theta_2(f1)}{2}\right\}\cos\left\{\frac{\theta_3(f1)}{2}\right\}+\sin\left\{\frac{\theta_3(f1)}{2}\right\}\cos\left\{\frac{\theta_2(f1)}{2}\right\}}{\cos\left\{\frac{\theta_2(f1)}{2}\right\}\cos\left\{\frac{\theta_3(f1)}{2}\right\}}\right]$$

-continued $$= \frac{1}{jZa}\frac{\sin\left\{\frac{\theta_2(f1)+\theta_3(f1)}{2}\right\}}{\cos\left\{\frac{\theta_2(f1)}{2}\right\}\cos\left\{\frac{\theta_3(f1)}{2}\right\}}$$

Therefore, the total impedance $Z_{all}$ at the pass frequency f1 can be expressed as follows.

$$Z_{a11} = jZa\frac{\cos\frac{\theta_2(f1)}{2}\cos\frac{\theta_3(f1)}{2}}{\sin\frac{\theta_2(f1)+\theta_3(f1)}{2}} \qquad \text{Expression 4}$$

When the total impedance $Z_{all}$ becomes infinite (∞), the whole second and third filters 2 and 3 become an open state, and the characteristic of only the first filter 1 is expressed at the pass frequency f1.

To make the total impedance $Z_{all}$ infinite (∞), the denominator of the expression 4 has to be zero (0).

$\sin[\{\theta_2(f1)+\theta_3(f1)\}/2]=0$

From the equation, the following is obtained.

$\theta_2(f1)+\theta_3(f1)=2n_1\pi$ $n_1$: arbitrary integer
The numerator should not be zero.

$\cos[\theta_2(f1)/2]\neq 0$ and $\cos[\theta_3(f1)/2]\neq 0$

From the above, the following is derived.

$\theta_2(f1)\neq(2p_1-1)\pi$ and $\theta_3(f1)\neq(2m_1-1)\pi$ $m_1, p_1$: arbitrary integers
The conditions of the denominator and the numerator are combined and the following conditions are obtained.

$\theta_2(f1)+\theta_3(f1)=2n_1\pi$ and $\theta_2(f1)\neq(2p_1-1)\pi, \theta_3(f1)\neq(2m_1-1)\pi$ \hfill (A1)

$n_1, m_1, p_1$: arbitrary integers

The expression (A1) relates to conditions for maintaining the excellent pass characteristic at the first pass frequency f1 in the triplexer circuit. Similarly, the conditions for maintaining the excellent pass characteristic at the second pass frequency f2 are obtained as follows.

$\theta_3(f2)+\theta_1(f2)=2n_2\pi$ and $\theta_3(f2)\neq(2p_2-1)\pi, \theta_1(f2)\neq(2m_2-1)\pi$ \hfill (A2)

$n_2, m_2, p_2$: arbitrary integers
Similarly, the conditions for maintaining the excellent pass characteristic at the third pass frequency f3 are obtained as follows.

$\theta_1(f3)+\theta_2(f3)=2n_3\pi$ and $\theta_1(f3)\neq(2p_3-1)\pi, \theta_2(f3)\neq(2m_3-1)\pi$ \hfill (A3)

$n_3, m_3, p_3$: arbitrary integers
Next, the obtained conditions (A1), (A2), and (A3) will be examined.

The impedance correlation at the first pass frequency f1 is already shown in FIG. 5. In the correlation diagram, when the following equation is given $$Za \cdot \cot\{\theta_2(f1)/2\} = X$$

and the condition (A1) is satisfied, the following is derived.

$$Za \cdot \cot\{\theta_3(f1)/2\} = Za \cdot \cot\{n\pi - \theta_2(f1)/2\} = -Za \cdot \cot\{\theta_2(f1)/2\} = -X$$

Figure 6:
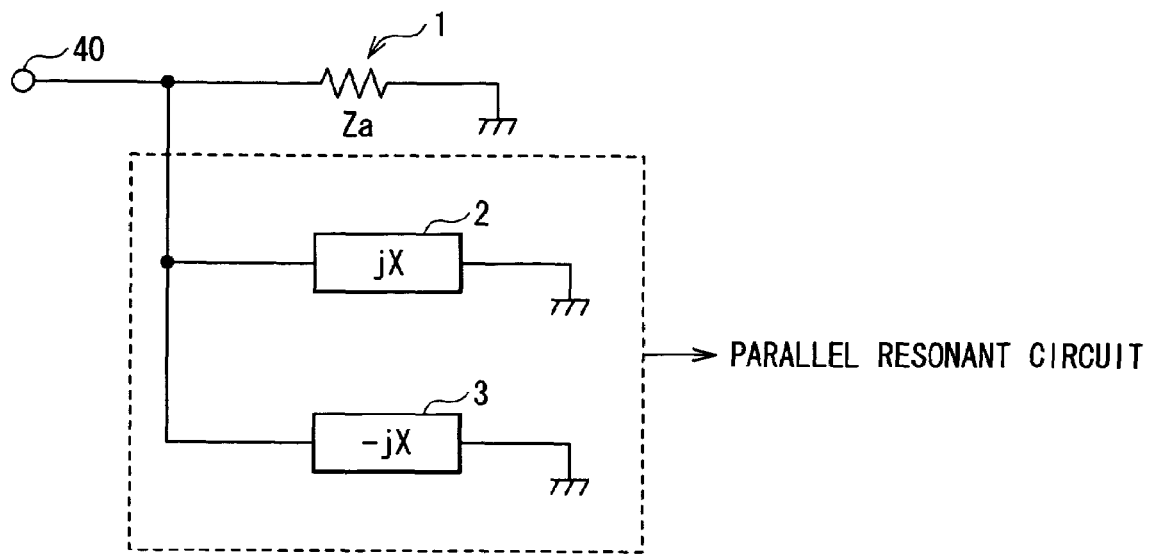
FIG. 6 is a diagram showing the correlation of impedances in the case of an impedance match when the pass frequency is f1 in the triplexer circuit of FIG. 1.

Therefore, when the condition (A1) is satisfied, the correlation of impedances at the first pass frequency f1 is as shown in FIG. 6. At this time, at the first pass frequency f1, the second and third filters 2 and 3 form a parallel resonant circuit as a whole. Consequently, at the first pass frequency f1, the second and third filters 2 and 3 do not exert an influence on the characteristic of the first filter 1.

In the case where both of the following equations $\theta_2(f1) \neq (2p_1-1)\pi$ and $\theta_3(f1) \neq (2m_1-1)\pi$ in the condition (A1) are not satisfied, for example, when $\theta_3(f1) = (2m_1-1)\pi$, the following is obtained.

$$Za \cdot \cot\{\theta_3(f1)/2\} = Za \cdot \cot\{(2m_1-1)/2\} = 0$$

Figure 7:
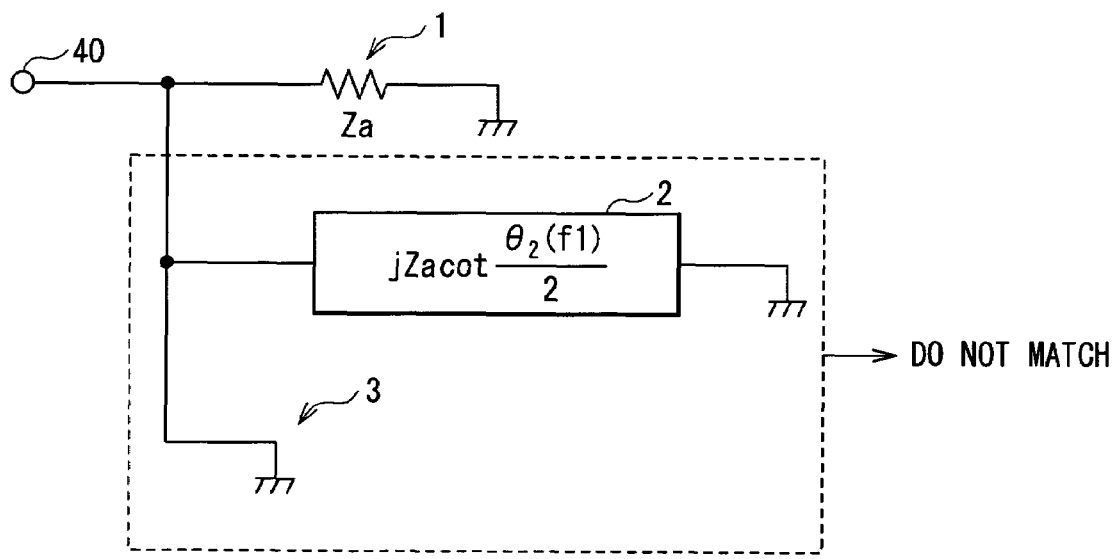
FIG. 7 is a diagram showing the correlation of impedances in the case of an impedance mismatch when the pass frequency is f1 in the triplexer circuit of FIG. 1.

The third filter 3 is shorted, so that the correlation of impedances at the first pass frequency f1 is as shown in FIG. 7. In this case, the impedances do not match at the first pass frequency f1.

By satisfying the conditions (A1), (A2), and (A3), the filters 1, 2, and 3 become independent without interfering with each other at each of the pass frequencies f1, f2, and f3. In such a manner, the filters 1, 2, and 3 can be designed independent of each other.

As described above, in the triplexer circuit according to the embodiment, the three filters 1, 2, and 3 are connected in parallel with each other and, for signals of the pass frequency band of one of the filters, the other two filters form a parallel resonant circuit. Consequently, the total impedance of the whole parallel resonant circuit becomes infinite ($\infty$), and the other two filters can be made open to the pass frequency band of the one filter. Therefore, with a simple configuration in which the three filters 1, 2, and 3 are just connected in parallel with each other, the impedance matching in each of the frequency bands is achieved, and excellent signal separation can be performed.

Second Embodiment

A triplexer circuit according to a second embodiment of the invention will be described.

Figure 8:
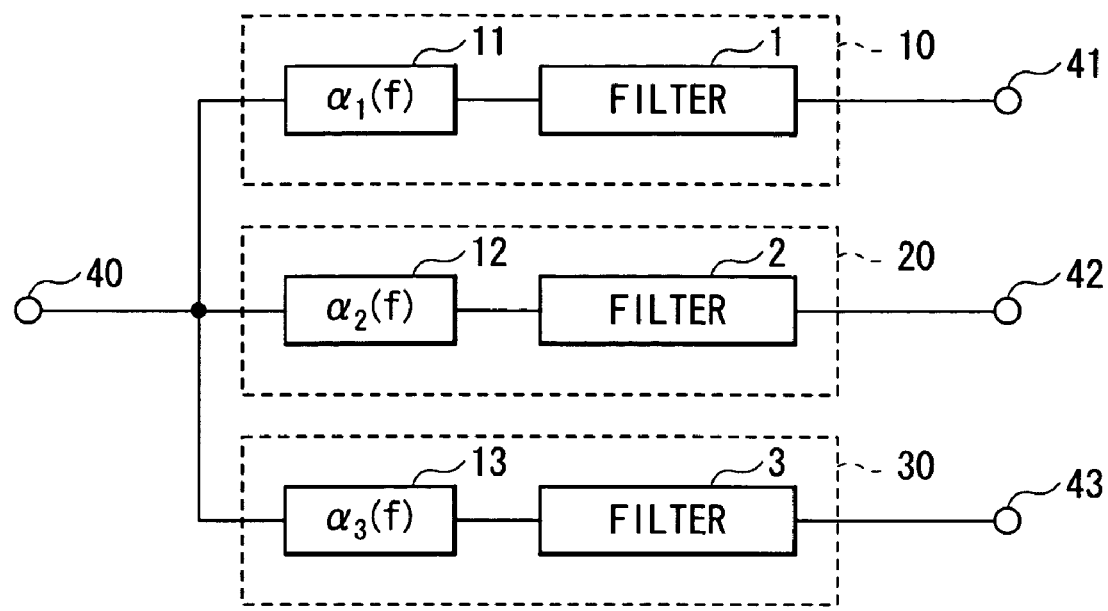
FIG. 8 is a circuit diagram showing the configuration of a triplexer circuit according to a second embodiment of the invention.

FIG. 8 shows an example of the configuration of a triplexer circuit according to the second embodiment. The same reference numerals are designated to substantially the same components as those of the triplexer circuit according to the first embodiment and their description will not be repeated. In the foregoing first embodiment (FIG. 1), the case where each of the filter modules is constructed by a single filter, and the first, second, and third filters satisfy the predetermined conditions (A1), (A2), and (A3), respectively, has been described. However, there may be a case where filters are designed and, as a result, the filters do not satisfy the conditions. In the second embodiment, a phase shifter for characteristic adjustment is provided so as to deal with such a situation.

In the triplexer circuit according to the second embodiment, each of filter modules is configured to have a filter and a phase shifter provided at the front stage of the filter and in series with the filter. Specifically, the triplexer circuit has a first filter module 10 constructed by a first filter 1 and a first phase shifter 11, a second filter module 20 constructed by a second filter 2 and a second phase shifter 12, and a third filter module 30 constructed by a third filter 3 and a third phase shifter 13. The input sides of the first, second, and third filters 10, 20, and 30 are connected to a common input port 40. The output side of the first filter module 10 is connected to a first output port 41, the output side of the second filter module 20 is connected to a second output port 42, and the output side of the third filter module 30 is connected to a third output port 43. Each of the phase shifters 11, 12, and 13 can be constructed by a single circuit device or a combination of a plurality of circuit devices such as L (inductor) and C (capacitor).

The triplexer circuit is constructed so that the second and third filter modules 20 and 30 form a parallel resonant circuit for signals in the first frequency band f1, the first and third filter modules 10 and 30 form a parallel resonant circuit for signals in the second frequency band f2, and the first and second filter modules 10 and 20 form a parallel resonant circuit for signals in the third frequency band f3.

In the triplexer circuit, phase adjustment can be performed in each of the phase shifters 11, 12, and 13. Consequently, for example, as compared with the case where each of the filter modules 10, 20, and 30 is constructed only by the filters 1, 2, and 3, respectively, an impedance matching can be adjusted more easily.

The conditions for performing an impedance matching in the triplexer circuit will be described hereinbelow. In the triplexer circuit, when each filter module obtained by adding a phase shifter to the circuit of FIG. 1 is regarded as a single filter, if the phase shifter is an ideal one, the pass characteristic (amplitude) of the filter is unchanged but only the phase of the reflection coefficient changes.

Figure 22:
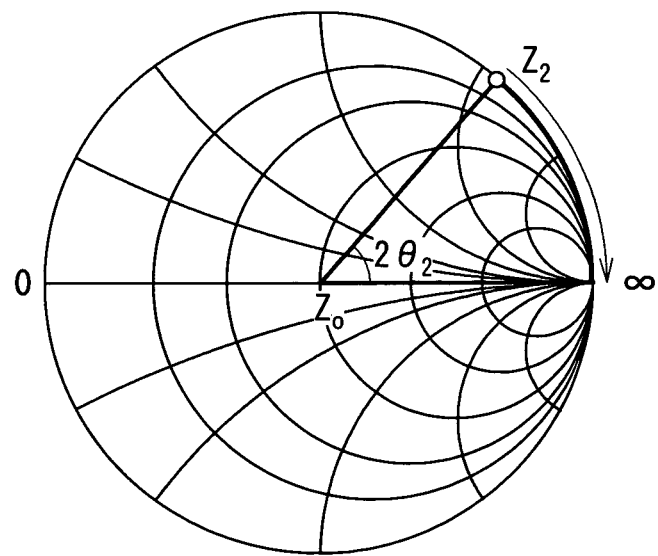
FIG. 22 is a diagram for explaining conditions of the electric length to be added.

It is assumed that the phase characteristics at the frequency f in the first, second, and third phase shifters 11, 12, and 13 are $\alpha_1(f)$, $\alpha_2(f)$, and $\alpha_3(f)$, respectively, and the reflection coefficient $\Gamma$ of each single phase shifter is zero. In a manner similar to the case described above by referring to FIG. 22, when a phase component is connected to a filter in series, the impedance moves clockwise by an amount of twice as large as the phase given by the phase component on a Smith chart. Consequently, the condition (A1) obtained in the first embodiment changes as follows in the triplexer circuit. $\alpha_2(f1)$ indicates a phase characteristic at the frequency f1 in the second phase shifter 12, and $\alpha_3(f1)$ indicates a phase characteristic at the frequency f1 in the third phase shifter 13. The meaning of the other signs is similar to that in the condition (A1).

$$\theta_2(f1)+\theta_3(f1)=2n_1\pi+2[\alpha_2(f1)+\alpha_3(f1)] \text{ and}$$

$$\theta_2(f1) \neq (2p_1-1)\pi+2\alpha_2(f1),$$

$$\theta_3(f1) \neq (2m_1-1)\pi+2\alpha_3(f1) \quad\quad (B1)$$

The expressions (B1) are conditions for maintaining an excellent pass characteristic at the first pass frequency f1 in the triplexer circuit. Similarly, the conditions for maintaining an excellent pass characteristic at the second pass frequency f2 are obtained as follows from the condition (A2) derived in the first embodiment. $\alpha_1(f2)$ denotes the phase characteristic at the frequency f2 in the first phase shifter 11, and $\alpha_3(f2)$ indicates the phase characteristic at the frequency f2 in the third phase shifter 13. The meaning of the other signs is similar to that of the condition (A2).

$$\theta_3(f2)+\theta_1(f2)=2n_2\pi+2[\alpha_3(f2)+\alpha_1(f2)] \text{ and}$$

$$\theta_3(f2) \neq (2p_2-1)\pi+2\alpha_3(f2),$$

$$\theta_1(f2) \neq (2m_2-1)\pi+2\alpha_1(f2) \quad\quad (B2)$$

Similarly, the conditions for maintaining an excellent pass characteristic at the third pass frequency f3 are obtained as follows from the condition (A3) derived in the first embodiment. $\alpha_1(f3)$ denotes the phase characteristic at the frequency f3 in the first phase shifter 11, and $\alpha_2(f3)$ indicates the phase characteristic at the frequency f3 in the second phase shifter 12. The meaning of the other signs is similar to that of the condition (A3).

$$\theta_1(f3)+\theta_2(f3)=2n_3\pi+2[\alpha_1(f3)+\alpha_2(f3)] \text{ and}$$

$$\theta_1(f3)\neq(2p_3-1)\pi+2\alpha_1(f3),$$

$$\theta_2(f3)\neq(2m_3-1)\pi+2\alpha_2(f3) \quad (B3)$$

By satisfying the conditions (B1), (B2), and (B3), phase adjustment is properly performed by the phase shifters 11, 12, and 13 so as to obtain an impedance matching.

Although FIG. 8 shows a configuration in which the phase shifter is connected at a front stage of each of the three filters 1, 2, and 3, a phase shifter may be connected to one or two of the three filters 1, 2, and 3.

As described above, in the triplexer circuit of the second embodiment, the phase shifter is connected at the front stage of each of the filters. Consequently, as compared with the case where the filter modules 10, 20, and 30 are constructed by the single filters 1, 2, and 3, respectively, an impedance matching can be adjusted more easily.

Third Embodiment

Next, a triplexer circuit according to a third embodiment of the invention will be described.

Figure 9:
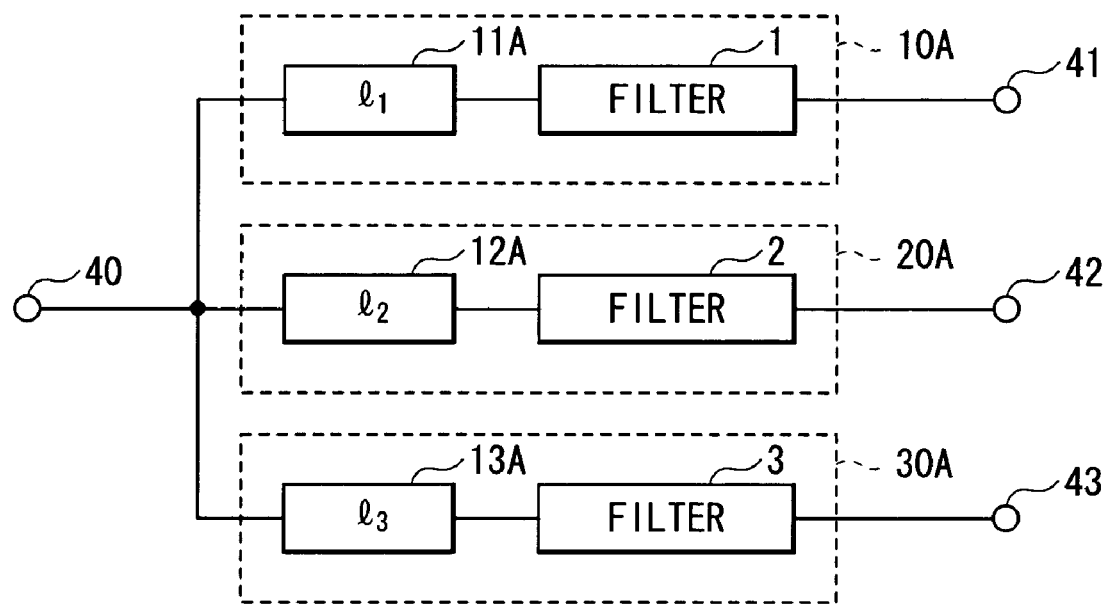
FIG. 9 is a circuit diagram showing the configuration of a triplexer circuit according to a third embodiment of the invention.

FIG. 9 shows an example of the configuration of a triplexer circuit according to the third embodiment. The same reference numerals are designated to substantially the same components as those of the triplexer circuit according to the first and second embodiments and their description will not be repeated. In the foregoing second embodiment (FIG. 8), the case where a phase shifter for characteristic adjustment is provided in a front stage of each of the filters has been described. The triplexer circuit according to the third embodiment has a transmission line as the phase shifter and performs characteristic adjustment by the transmission line.

In the triplexer circuit according to the third embodiment, each of filter modules is constructed by a filter and a transmission line provided at the front stage of the filter and in series with the filter. Specifically, the triplexer circuit has a first filter module 10A constructed by a first filter 1 and a first transmission line 11A, a second filter module 20A constructed by a second filter 2 and a second transmission line 12A, and a third filter module 30A constructed by a third filter 3 and a third transmission line 13A. The first, second, and third transmission lines 11A, 12A, and 13A can be constructed by, for example, TEM lines. As the TEM lines, for example, microstrip lines, coaxial lines, and strip lines can be used. The first, second, and third transmission lines 11A, 12A, and 13A may be lines of the same kind or different kinds.

The input sides of the first, second, and third filter modules 10A, 20A, and 30A are connected to a common input port 40. The output side of the first filter module 10A is connected to a first output port 41, the output side of the second filter module 20A is connected to a second output port 42, and the output side of the third filter module 30A is connected to a third output port 43.

The triplexer circuit is constructed so that the second and third filter modules 20A and 30A form a parallel resonant circuit for signals in the first frequency band f1, the first and third filter modules 10A and 30A form a parallel resonant circuit for signals in the second frequency band f2, and the first and second filter modules 10A and 20A form a parallel resonant circuit for signals in the third frequency band f3.

In the triplexer circuit, phase adjustment can be performed in each of the transmission lines 11A, 12A, and 13A. Consequently, for example, as compared with the case where each of the filter modules 10A, 20A, and 30A is constructed only by the filters 1, 2, and 3, respectively, an impedance matching can be adjusted more easily.

The conditions for performing an impedance matching in the triplexer circuit will be described hereinbelow. In the triplexer circuit as in the triplexer circuit shown in FIG. 8, when each filter module obtained by adding a transmission line to the circuit of FIG. 1 is regarded as a single filter, if the transmission line is an ideal one, the pass characteristic (amplitude) of the filter is unchanged but only the phase of the reflection coefficient changes.

Physical lengths in the first, second, and third transmission lines 11A, 12A, and 13A are set as $l_1$, $l_2$, and $l_3$, respectively, and the characteristic impedance is set as Za. Propagation constants of the first, second, and third transmission lines 11A, 12A, and 13A are set as $\beta_1(f)$, $\beta_2(f)$, and $\beta_3(f)$, respectively, as functions of the frequency f. The propagation constant $\beta i(f)$ of the i-th transmission line is defined as follows. $\sqrt{\ }$ denotes the square root of $\epsilon_{ri}\mu_{ri}$.

$$\beta i(f)=(2\pi f/c)\cdot\sqrt{\epsilon_{ri}\mu_{ri}}=k_i f$$

where c: light velocity
$\epsilon_{ri}$: relative permittivity of the i-th transmission line
$\mu_{ri}$: relative magnetic permeability of the i-th transmission line $$ki=2\pi\sqrt{\epsilon_{ri}\mu_{ri}}/c$$

In a manner similar to the case described above by referring to FIG. 22, when a phase component is connected to a filter in series, the impedance moves clockwise by an amount of twice as large as the phase given by the phase component on a Smith chart. Consequently, a phase change by the i-th transmission line is expressed as follows.

$$-2\beta_i(f)l_i=-2k_i l_i f$$

In a manner similar to the case where a phase shifter is connected, the condition (A1) obtained in the first embodiment changes as follows in the triplexer circuit. The same signs as those of the condition (A1) have the same meaning as that of the condition (A1).

$$\theta_2(f1)+\theta_3(f1)=2n_1\pi+2[k_2 l_2 f1+k_3 l_3 f1] \quad (C11) \text{ and}$$

$$\theta_2(f1)\neq(2p_1-1)\pi+2k_2 l_2 f1,$$

$$\theta_3(f1)\neq(2m_1-1)\pi+2k_3 l_3 f1, \quad (C12)$$

The expressions (C11) and (C12) denote conditions for maintaining an excellent pass characteristic at the first pass frequency f1 in the triplexer circuit. Similarly, conditions for maintaining an excellent pass characteristic at the second pass frequency f2 are obtained as follows from the conditions (A2) derived in the first embodiment. The same signs as those of the condition (A2) have the same meaning as that of the condition (A2).

$$\theta_3(f2)+\theta_1(f2)=2n_2\pi+2[k_3 l_3 f2+k_1 l_1 f2] \quad (C21) \text{ and}$$

$$\theta_3(f2)\neq(2p_2-1)\pi+2k_3 l_3 f2,$$

$$\theta_1(f2)\neq(2m_2-1)\pi+2k_1 l_1 f2, \quad (C22)$$

Similarly, conditions for maintaining an excellent pass characteristic at the third pass frequency f3 are obtained as follows from the conditions (A3) derived in the first embodiment. The same signs as those of the condition (A3) have the same meaning as that of the condition (A3).

$$\theta_1(f3)+\theta_2(f3)=2n_3\pi+2[k_1l_1f3+k_2l_2f3] \quad \text{(C31) and}$$

$$\theta_1(f3)\neq(2p_3-1)\pi+2k_1l_1f3,$$

$$\theta_2(f3)\neq(2m_3-1)\pi+2k_2l_2f3, \quad \text{(C32)}$$

By satisfying the conditions, the phase adjustment can be performed properly by the first, second, and third transmission lines 11A, 12A, and 13A so as to obtain an impedance matching. The lengths $l_1$, $l_2$, and $l_3$ for obtaining an impedance matching from the conditions are derived as follows.

From the expressions (C11), (C21), and (C31), the following is obtained.

$$k_2l_2+k_3l_3=[\theta_2(f1)+\theta_3(f1)-2n_1\pi]/2f1$$

$$k_1l_1+k_3l_3=[\theta_3(f2)+\theta_1(f2)-2n_2\pi]/2f2$$

$$k_1l_1+k_2l_2=[\theta_1(f3)+\theta_2(f3)-2n_3\pi]/2f3$$

From the simultaneous equations, the following is obtained.

$$k_1\ell_1+k_2\ell_2+k_3\ell_3=\frac{\theta_2(f1)+\theta_3(f1)-2n_1\pi}{4f1}+\frac{\theta_3(f2)+\theta_1(f2)-2n_2\pi}{4f2}+\frac{\theta_1(f3)+\theta_2(f3)-2n_3\pi}{4f3} \quad \text{Expression 5}$$

Further, the following equations are obtained.

$$\therefore k_1\ell_1=-\frac{\theta_2(f1)+\theta_3(f1)-2n_1\pi}{4f1}+\frac{\theta_3(f2)+\theta_1(f2)-2n_2\pi}{4f2}+\frac{\theta_1(f3)+\theta_2(f3)-2n_3\pi}{4f3} \quad \text{Expression 6}$$

$$k_2\ell_2=\frac{\theta_2(f1)+\theta_3(f1)-2n_1\pi}{4f1}-\frac{\theta_3(f2)+\theta_1(f2)-2n_2\pi}{4f2}+\frac{\theta_1(f3)+\theta_2(f3)-2n_3\pi}{4f3} \quad \text{Expression 7}$$

$$k_3\ell_3=\frac{\theta_2(f1)+\theta_3(f1)-2n_1\pi}{4f1}+\frac{\theta_3(f2)+\theta_1(f2)-2n_2\pi}{4f2}-\frac{\theta_1(f3)+\theta_2(f3)-2n_3\pi}{4f3} \quad \text{Expression 8}$$

Therefore, the physical lengths $l_1$, $l_2$, and $l_3$ of the transmission lines 11A, 12A, and 13A can be expressed as follows.

$$\ell_1=\frac{c}{2\pi\sqrt{\varepsilon_{r1}\mu_{r1}}}\left\{-\frac{\theta_2(f1)+\theta_3(f1)-2n_1\pi}{4f1}+\frac{\theta_3(f2)+\theta_1(f2)-2n_2\pi}{4f2}+\frac{\theta_1(f3)+\theta_2(f3)-2n_3\pi}{4f3}\right\} \quad \text{Expression 9}$$

$$\ell_2=\frac{c}{2\pi\sqrt{\varepsilon_{r2}\mu_{r2}}}\left\{\frac{\theta_2(f1)+\theta_3(f1)-2n_1\pi}{4f1}-\frac{\theta_3(f2)+\theta_1(f2)-2n_2\pi}{4f2}+\frac{\theta_1(f3)+\theta_2(f3)-2n_3\pi}{4f3}\right\} \quad \text{Expression 10}$$

$$\ell_3=\frac{c}{2\pi\sqrt{\varepsilon_{r3}\mu_{r3}}}\left\{\frac{\theta_2(f1)+\theta_3(f1)-2n_1\pi}{4f1}+\frac{\theta_3(f2)+\theta_1(f2)-2n_2\pi}{4f2}-\frac{\theta_1(f3)+\theta_2(f3)-2n_3\pi}{4f3}\right\} \quad \text{Expression 11}$$

From the conditional expressions (C12), (C22), and (C32), the following conditional expressions are derived.

$$\ell_1\neq\frac{c\{\theta_1(f2)-(2p_1-1)\pi\}}{4\pi\sqrt{\varepsilon_{r1}\mu_{r1}}\,f2}, \quad \text{Expressions 12}$$

$$\ell_1\neq\frac{c\{\theta_1(f3)-(2m_1-1)\pi\}}{4\pi\sqrt{\varepsilon_{r1}\mu_{r1}}\,f3}$$

$$\ell_2\neq\frac{c\{\theta_1(f1)-(2p_2-1)\pi\}}{4\pi\sqrt{\varepsilon_{r2}\mu_{r2}}\,f1}, \quad \text{Expressions 13}$$

$$\ell_2\neq\frac{c\{\theta_2(f3)-(2m_2-1)\pi\}}{4\pi\sqrt{\varepsilon_{r2}\mu_{r2}}\,f3}$$

$$\ell_3\neq\frac{c\{\theta_1(f1)-(2p_3-1)\pi\}}{4\pi\sqrt{\varepsilon_{r3}\mu_{r3}}\,f1}, \quad \text{Expressions 14}$$

$$\ell_3\neq\frac{c\{\theta_3(f2)-(2m_3-1)\pi\}}{4\pi\sqrt{\varepsilon_{r3}\mu_{r3}}\,f2}$$

By adding the lengths $l_1$, $l_2$, and $l_3$ satisfying all of the conditional expressions 9 to 14 as the transmission lines 11A, 12A, and 13A, an impedance matching of each pass frequency band can be obtained. Even if the values of $l_1$, $l_2$, and $l_3$ have an error of about, for example, ±10% from the values of the expressions, there is no problem in practical use.

Although FIG. 9 shows the configuration in which the transmission lines are connected at the front stage of the three filters 1, 2, and 3, the transmission line(s) may be connected to only one or two filters out of the three filters 1, 2, and 3. Therefore, in the conditional expressions 9 to 14, $n_1$, $n_2$, $n_3$, $m_1$, $m_2$, $m_3$, $p_1$, $p_2$, and $p_3$ express arbitrary integers satisfying $l_1, l_2, l_3 \geq 0$ (where $l_1$, $l_2$, and $l_3$ are not simultaneously equal to 0).

Next, an example of the design procedure taken in the case of designing a triplexer circuit by connecting such transmission lines will be described.

First Designing Method

First, each of the first, second, and third filters 1, 2, and 3 is singly designed and the characteristics of each filter are obtained. Next, the transmission lines having lengths $l_1$, $l_2$, and $l_3$ satisfying all of the expressions 9 to 14 are added to the filters, thereby adding the electric lengths. By connecting the filters to which the electric lengths are added, a triplexer is configured. This is the simplest designing method which is considered to be suited to the case of using dielectric filters as the filters.

Second Designing Method

First, by optimizing device parameters of the first, second, and third filters 1, 2, and 3 so as to satisfy the conditions (A1), (A2), and (A3) obtained in the first embodiment, a triplexer is designed (to improve isolation among the filters). When an optimal solution is not obtained, a transmission line is further provided to add an electric length, thereby adjusting the phase. In the case of using a laminated filter as the filter, this designing method is considered to be suitable.

Concrete Example

A concrete designing example according to the first designing method will be described hereinbelow.

Figure 10:
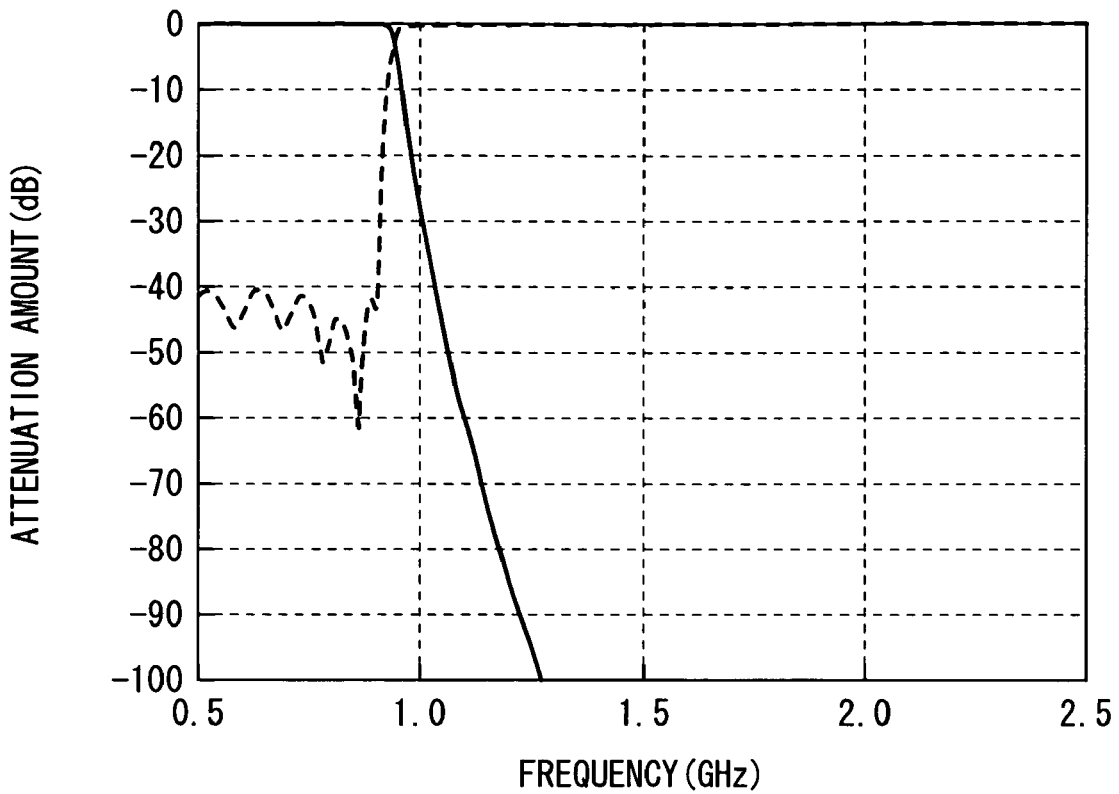
FIG. 10 is a diagram showing a characteristic example of only a first filter in the triplexer circuit of FIG. 9.

As the first filter 1, a Chebyshev lowpass filter was designed. The number of stages was set as 20, the ripple width was set as 0.0001 dB, and the cutoff frequency fc was set as 900 MHz. FIG. 10 shows the characteristics of the designed lowpass filter. The horizontal axis denotes frequency (GHz), and the vertical axis indicates an attenuation amount (dB). The solid line indicates a pass characteristic, and a broken line indicates a reflection characteristic.

Figure 11:
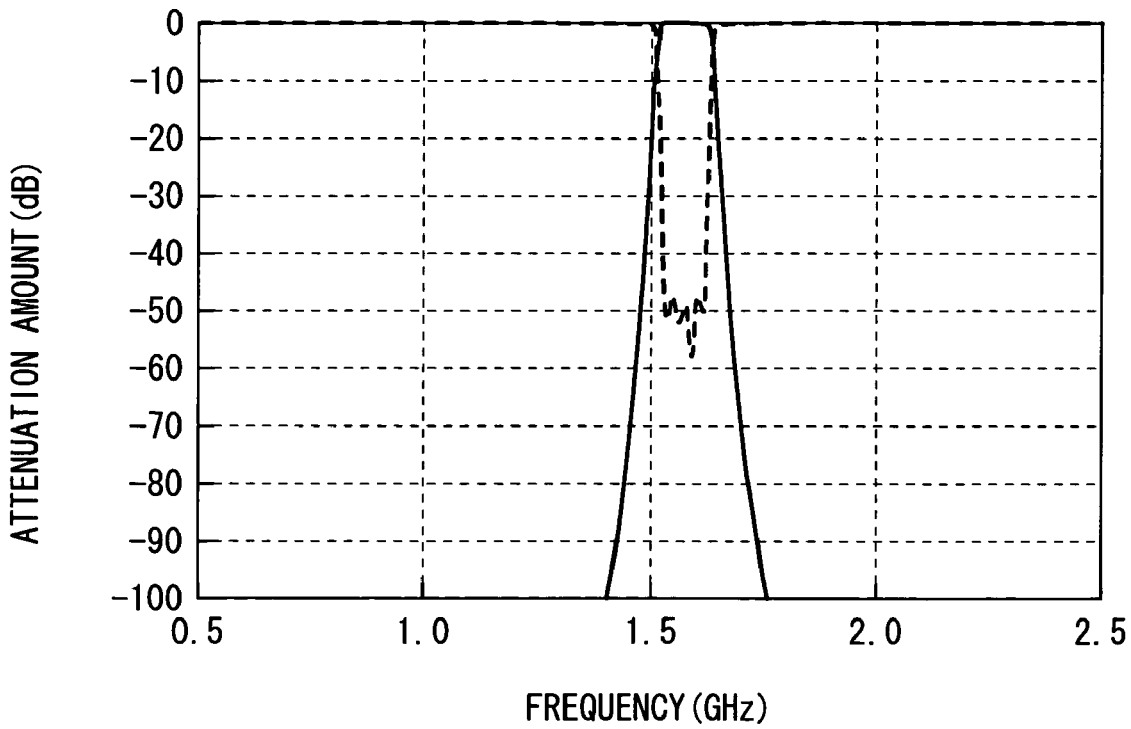
FIG. 11 is a diagram showing a characteristic example of only a second filter in the triplexer circuit of FIG. 9.

As the second filter 2, a Chebyshev bandpass filter was designed. The number of stages was set as 9, the ripple width was set as 0.0001 dB, the center frequency f0 was set as 1,575 MHz, and the band width was set as 100 MHz. FIG. 11 shows the characteristics of the designed bandpass filter. The solid line indicates a pass characteristic, and a broken line indicates a reflection characteristic.

Figure 12:
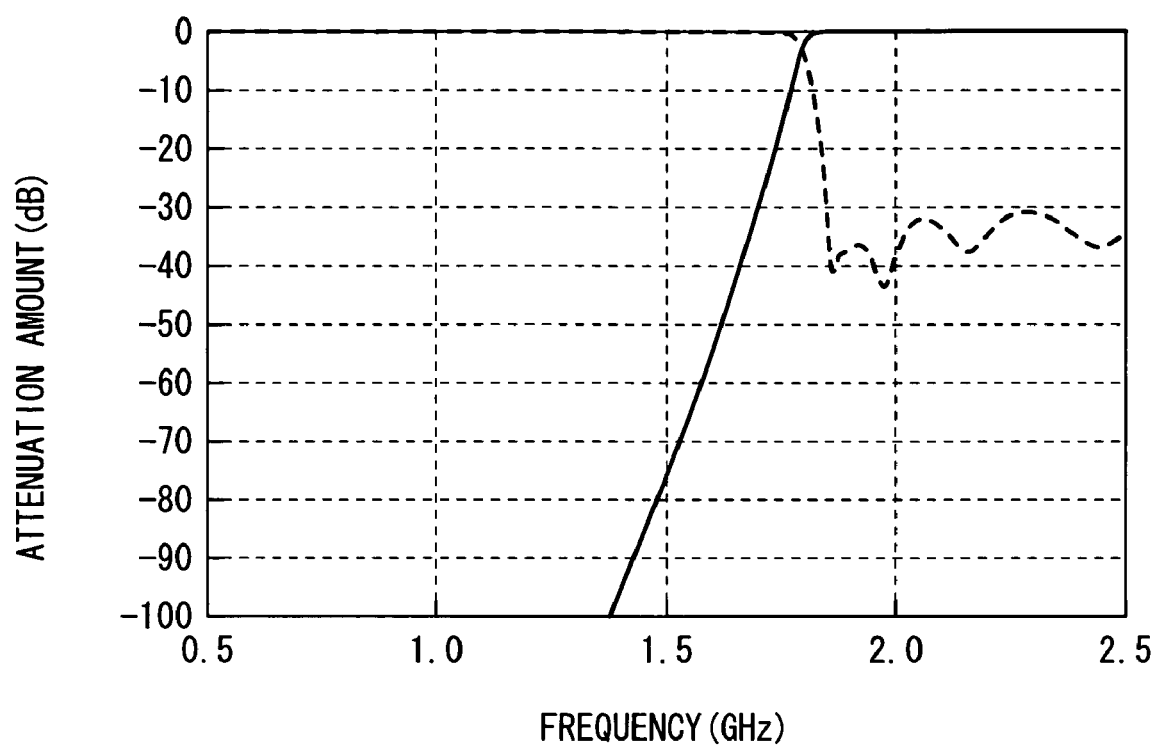
FIG. 12 is a diagram showing a characteristic example of only a third filter in the triplexer circuit of FIG. 9.

As the third filter 3, a Chebyshev highpass filter was designed. The number of stages was set as 20, the ripple width was set as 0.0001 dB, and the cutoff frequency fc was set as 1,850 MHz. FIG. 12 shows the characteristics of the designed highpass filter. The solid line indicates a pass characteristic, and a broken line indicates a reflection characteristic.

Assuming that the pass frequency f1=860 MHz, the pass frequency f2=1,575 MHz, and the pass frequency f3=1,870 MHz, the phase $\theta_i(f)$ of the reflection coefficient of each of the filters was obtained. With respect to the first filter 1, the following phases were obtained.

$\theta_1(f2)=-33.96°$ $\theta_1(f3)=-62.29°$

With respect to the second filter 2, the following phases were obtained.

$\theta_2(f3)=-135.70°$ $\theta_2(f1)=168.21°$

With respect to the third filter 3, the following phases were obtained.

$\theta_3(f1)=89.19°$ $\theta_3(f2)=-51.01°$

When the obtained phases are substituted for the conditional expressions 11 to 16, the parameters are properly selected, and calculation is executed, electric lengths actually added are derived. The calculation was executed by setting the effective relative permittivity to 1. As an example, when $n_1=0$, $n_2=-2$, and $n_3=-2$, the values $l_1=79.7$ mm, $l_2=36.5$ mm, and $l_3=88.1$ mm were obtained.

Figure 13:
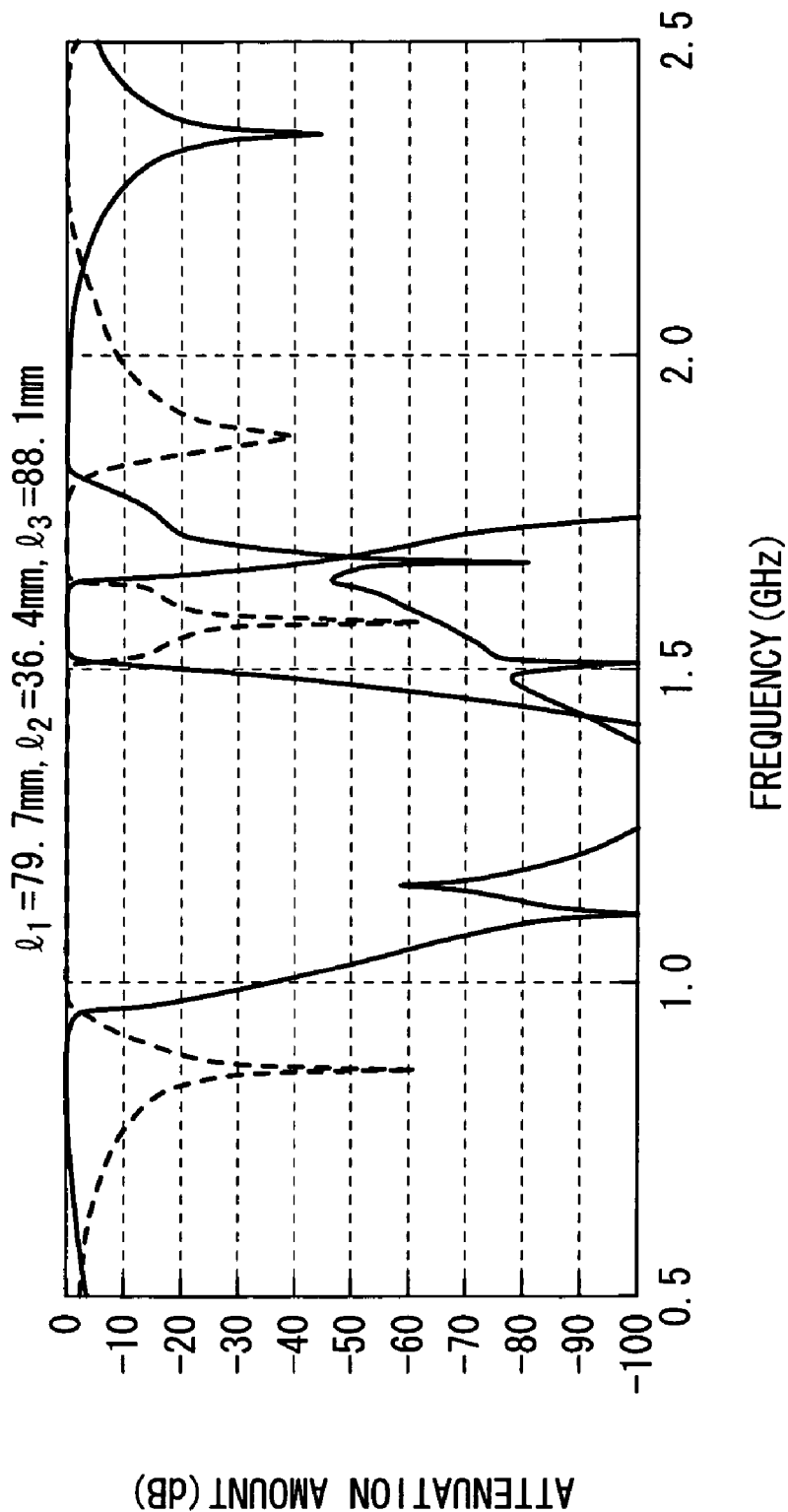
FIG. 13 is a diagram showing a characteristic example of a whole circuit when an ideal electric length is added in the triplexer circuit of FIG. 9.

FIG. 13 shows characteristics when $l_1$, $l_2$, and $l_3$ are set to the ideal values and the triplexer circuit of FIG. 9 is constructed. The solid line indicates the pass characteristic, and the broken line indicates the reflection characteristic. As understood from FIG. 13, matching among the filters is excellently obtained and characteristics equivalent to those (FIGS. 10 to 12) in the filters are obtained at each of the frequency bands.

Figure 14:
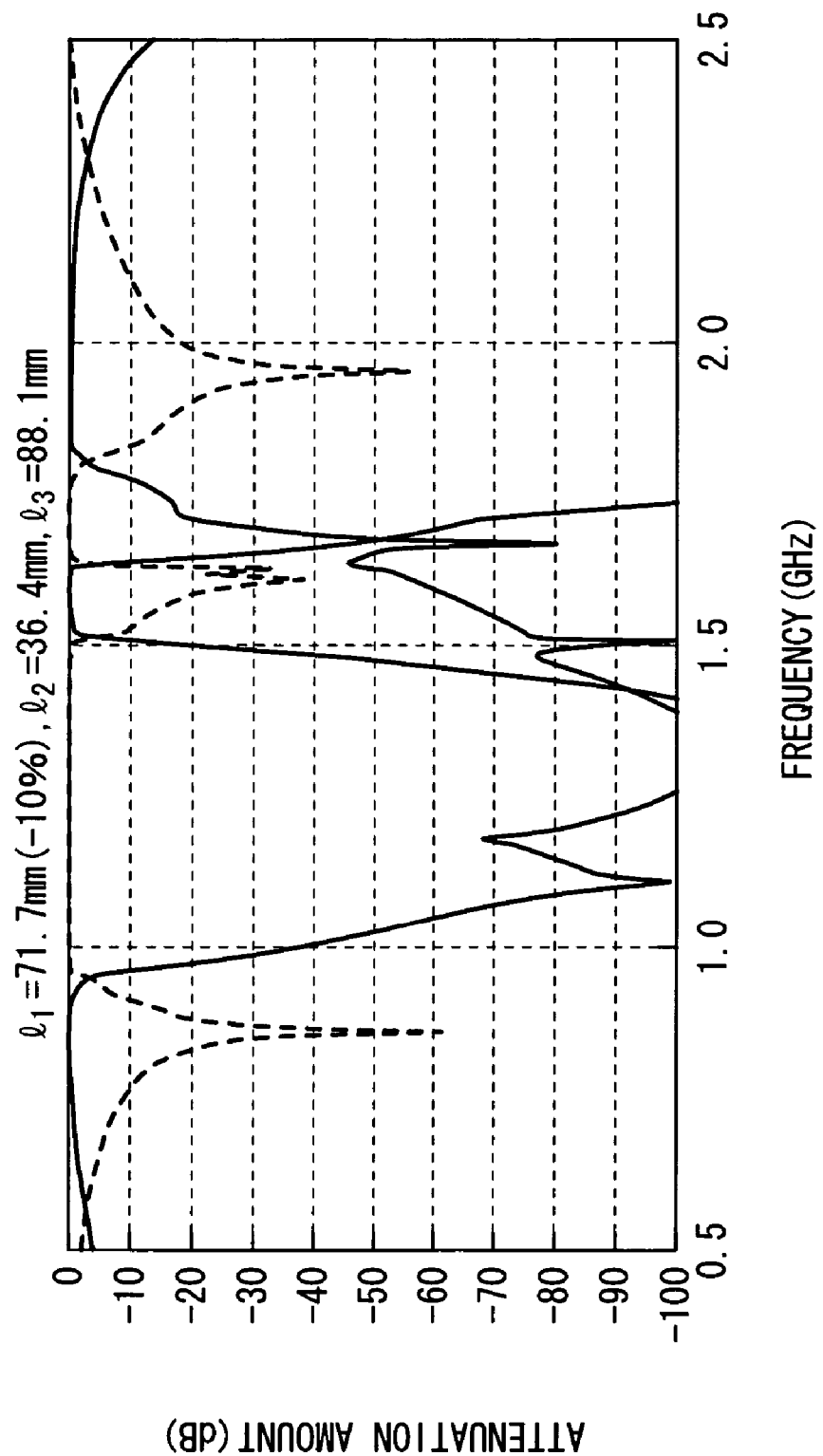
FIG. 14 is a diagram showing a characteristic example of a whole circuit when an electric length of a value deviated from an ideal value by −10% as $l_1$ in the triplexer circuit of FIG. 9.
Figure 15:
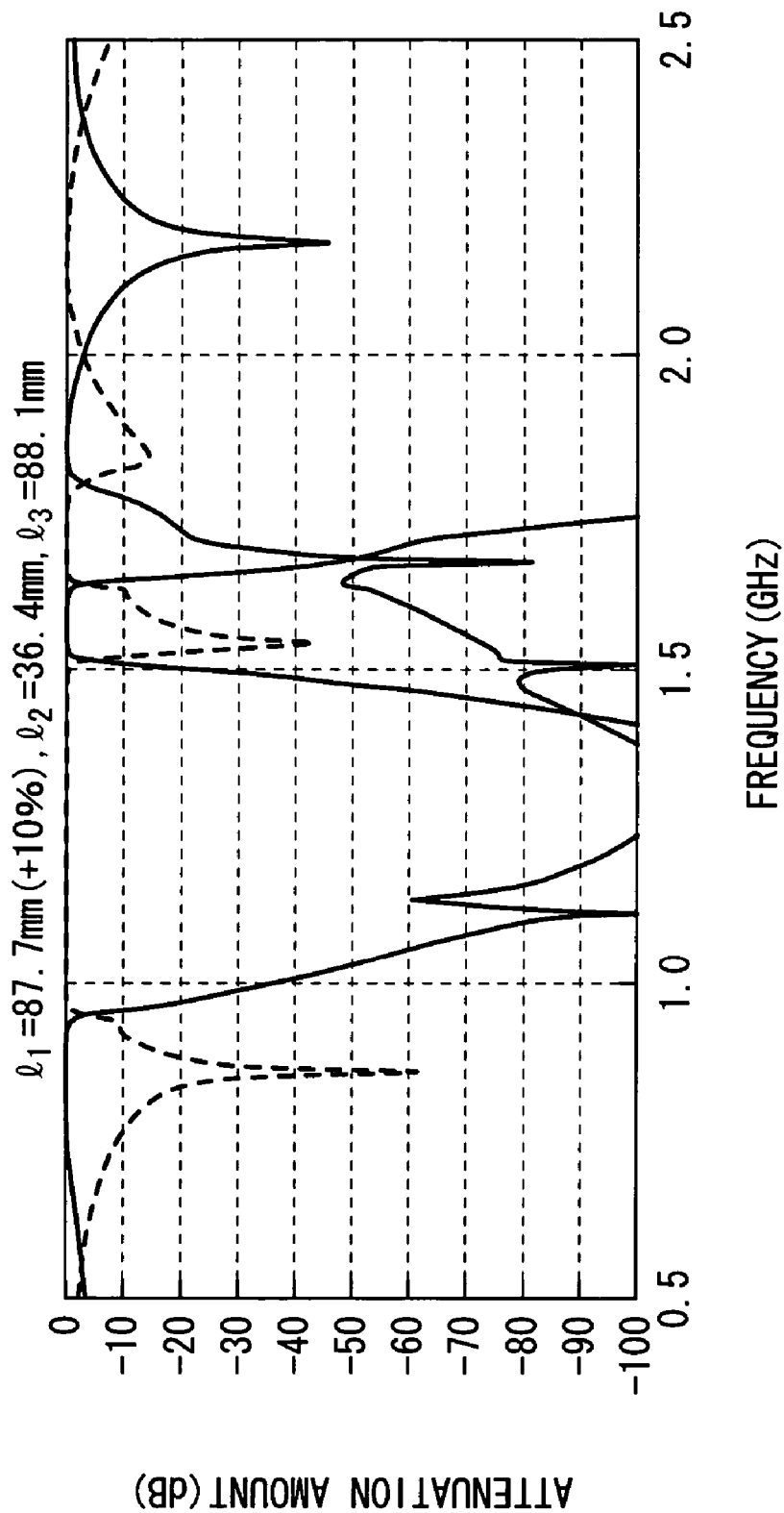
FIG. 15 is a diagram showing a characteristic example of a whole circuit when an electric length of a value deviated from an ideal value by +10% as $l_1$ in the triplexer circuit of FIG. 9.
Figure 16:
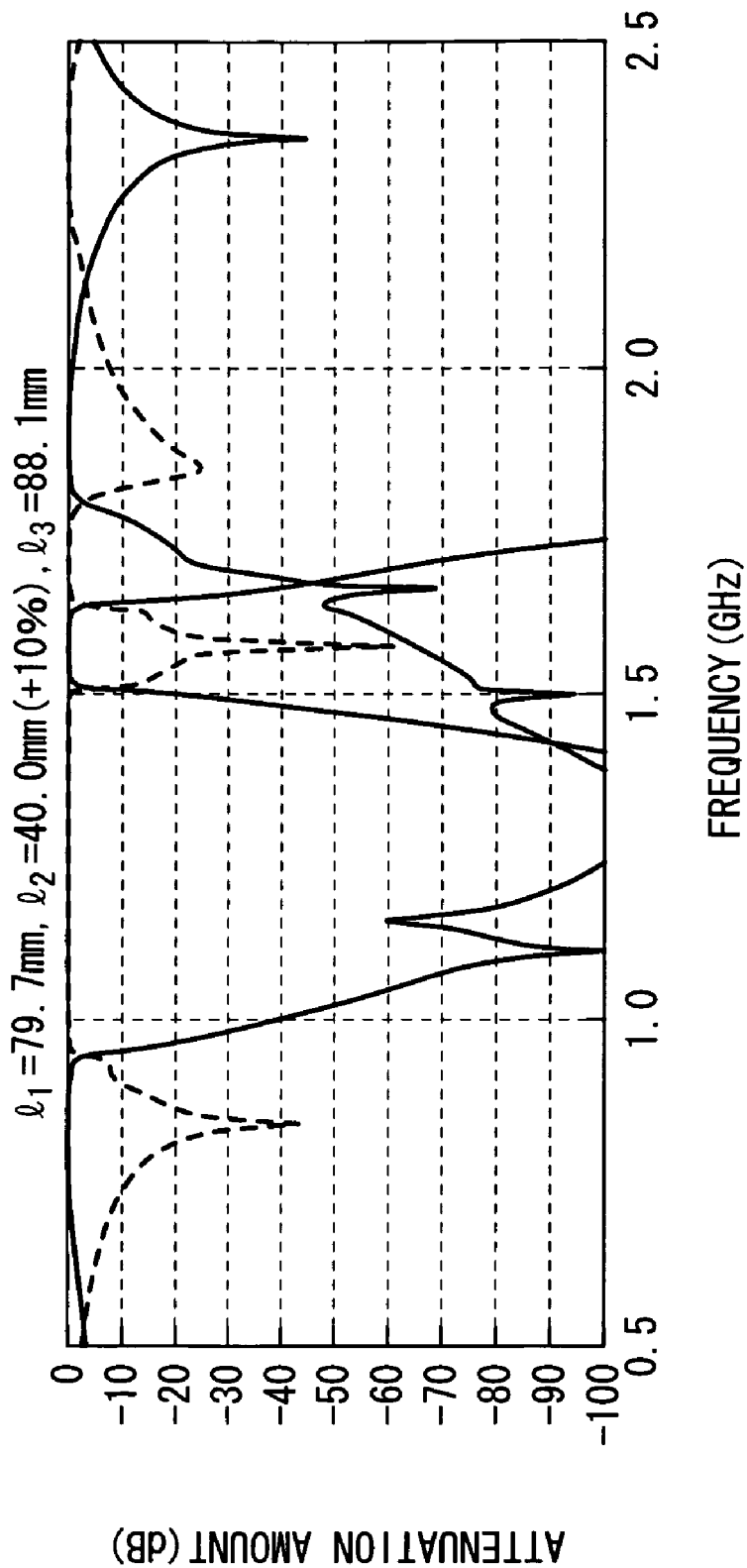
FIG. 16 is a diagram showing a characteristic example of a whole circuit when an electric length of a value deviated from an ideal value by +10% as $l_2$ in the triplexer circuit of FIG. 9.
Figure 17:
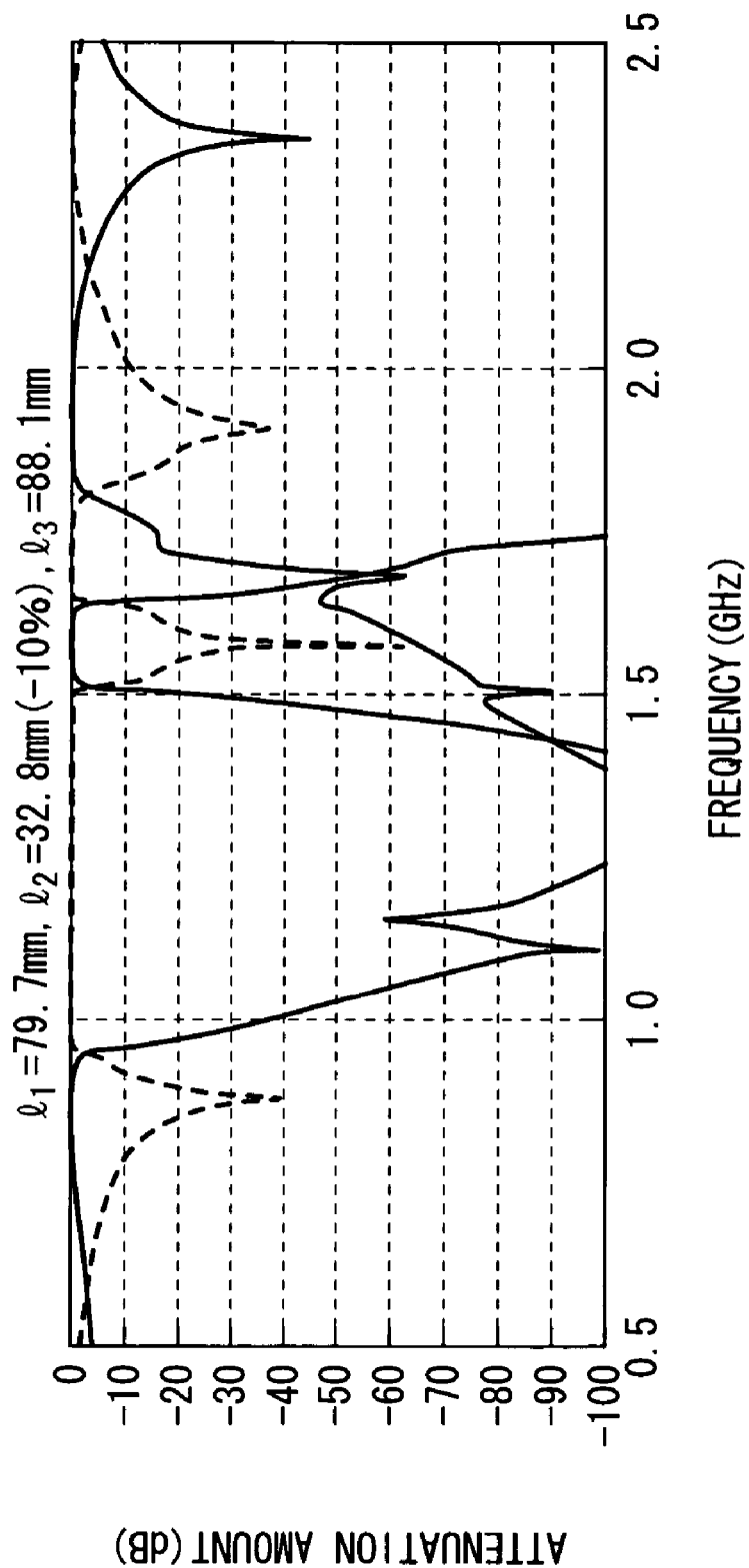
FIG. 17 is a diagram showing a characteristic example of a whole circuit when an electric length of a value deviated from an ideal value by −10% as $l_2$ in the triplexer circuit of FIG. 9.
Figure 18:
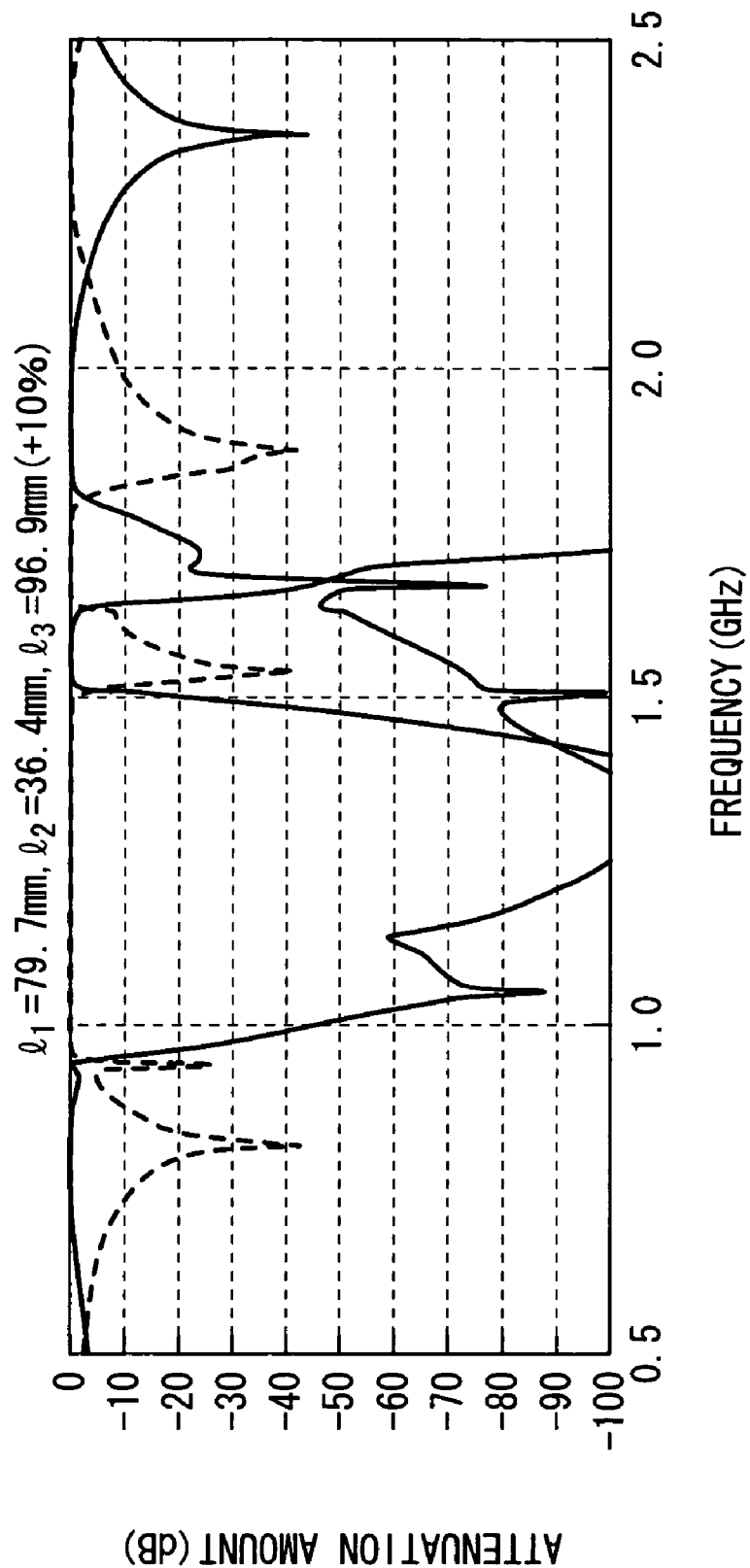
FIG. 18 is a diagram showing a characteristic example of a whole circuit when an electric length of a value deviated from an ideal value by +10% as $l_3$ in the triplexer circuit of FIG. 9.
Figure 19:
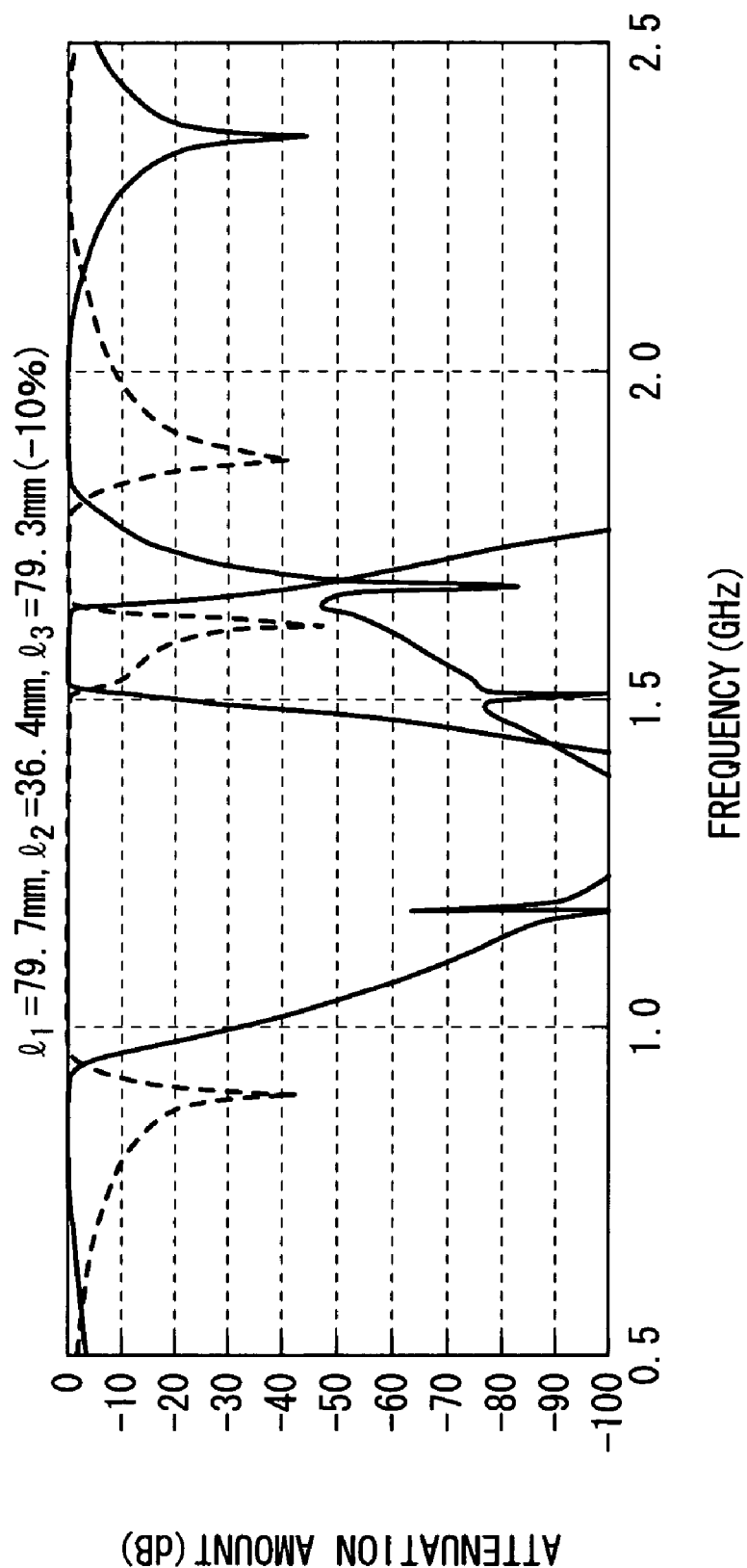
FIG. 19 is a diagram showing a characteristic example of a whole circuit when an electric length of a value deviated from an ideal value by −10% as $l_3$ in the triplexer circuit of FIG. 9.
Figure 20:
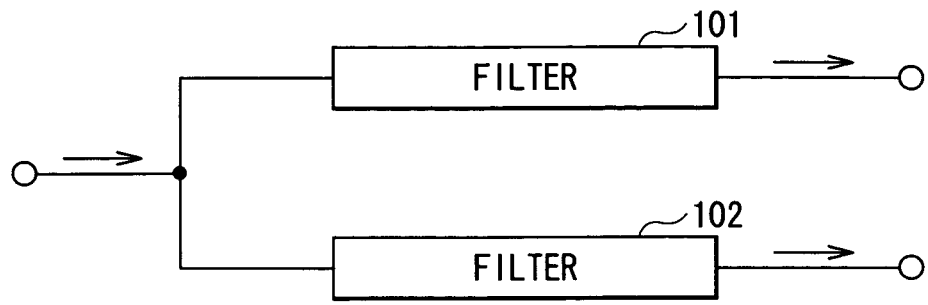
FIG. 20 is a diagram showing the configuration of a duplexer.
Figure 21:
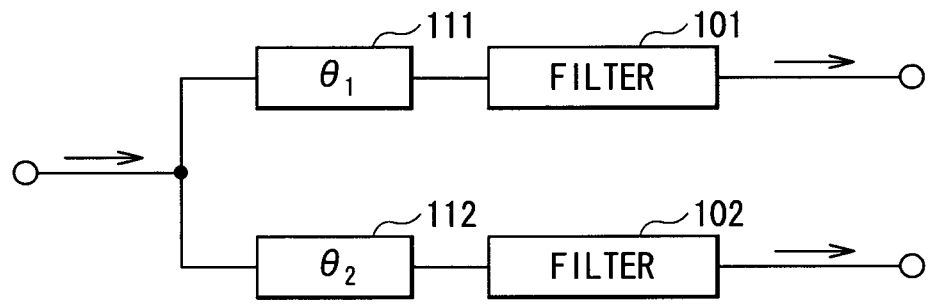
FIG. 21 is a diagram showing the configuration of a duplexer to which an electric length for impedance matching is added.

Characteristics when the values $l_1$, $l_2$, and $l_3$ were changed by ±10% from the ideal values were verified. FIG. 14 shows characteristics when the value $l_1$ is changed from the ideal value by −10% to 71.7 mm. FIG. 15 shows characteristics when the value $l_1$ is changed from the ideal value by +10% to 87.7 mm. FIG. 16 shows characteristics when the value $l_2$ is changed from the ideal value by +10% to 40.0 mm. FIG. 17 shows characteristics when the value $l_2$ is changed from the ideal value by −10% to 32.8 mm. FIG. 18 shows characteristics when the value $l_3$ is changed from the ideal value by +10% to 96.9 mm. FIG. 19 shows characteristics when the value $l_3$ is changed from the ideal value by −10% to 79.3 mm. In FIGS. 14 to 19, the solid line indicates the pass characteristic, and the broken line indicates the reflection characteristic. As understood from the characteristic diagrams, even when $l_1$, $l_2$, and $l_3$ are deviated from ideal values by ±10%, excellent characteristics causing no problem in actual use are obtained.

Since the conditions (C11), (C12), (C21), (C22), (C31), and (C32) related to the first, second, and third transmission lines 11A, 12A, and 13A correspond to the conditions (B1), (B2), and (B3) related to the first, second, and third phase shifters 11, 12, and 13, respectively, even when the lengths $l_1$, $l_2$, and $l_3$ of the lines are deviated from ideal values by ±10%, excellent characteristics causing no problem in actual use are obtained. It means that even when the phase characteristics $\alpha 2(f1)$, $\alpha 3(f1)$, $\alpha 3(f2)$, $\alpha 1(f2)$, $\alpha 1(f3)$, and $\alpha 2(f3)$ are deviated from ideal values by ±10%, excellent characteristics causing no problem in actual use are obtained.

As described above, in the triplexer circuit according to the embodiment, transmission lines are connected at the front stage of the filters. Consequently, as compared with the case where the filter modules 10A, 20A, and 30A are constructed by the single filters 1, 2, and 3, respectively, an impedance matching can be adjusted more easily.

It should be understood by those skilled in the art that various modifications, combinations, sub-combinations and alterations may occur depending on design requirements and other factors insofar as they are within the scope of the appended claims or the equivalents thereof.

What is claimed is:

1. A triplexer circuit for separating an input signal into signals in three frequency bands which are different from each other, comprising:

a first filter module that passes signals in a first frequency band;

a second filter module that passes signals in a second frequency band; and a third filter module that passes signals in a third frequency band, wherein the first, second, and third filter modules are connected in parallel with each other, the second and third filter modules form a parallel resonant circuit for signals in the first frequency band, the first and third filter modules form a parallel resonant circuit for signals in the second frequency band, and the first and second filter modules form a parallel resonant circuit for signals in the third frequency band, wherein when a pass frequency of the first filter module is f1, a pass frequency of the second filter module is f2, and a pass frequency of the third filter module is f3, phase components of reflection coefficients at the pass frequencies f1, f2, and f3 in the filter modules satisfy the following conditions:

$\theta_2(f1)+\theta_3(f1)=2n_1\pi$ and $\theta_2(f1)\neq(2p_1-1)\pi, \theta_3(f1)\neq(2m_1-1)\pi$     (A1)

$\theta_3(f2)+\theta_1(f2)=2n_2\pi$ and $\theta_3(f2)\neq(2p_2-1)\pi, \theta_1(f2)\neq(2m_2-1)\pi$  (A2)

$\theta_1(f3)+\theta_2(f3)=2n_3\pi$ and $\theta_1(f3)\neq(2p_3-1)\pi, \theta_2(f3)\neq(2m_3-1)$  (A3)

where $\theta_i(f1)$: phase of a reflection coefficient at the frequency f1 in the i-th (=1, 2, 3) filter module, $\theta_i(f2)$: phase of a reflection coefficient at the frequency f2 in the i-th filter module, $\theta_i(f3)$: phase of a reflection coefficient at the frequency f3 in the i-th filter module, $n_1, n_2, n_3, m_1, m_2, m_3, p_1, p_2, p_3$: arbitrary integers.

2. A triplexer circuit for separating an input signal into signals in three frequency bands which are different from each other, comprising:

a first filter module that passes signals in a first frequency band;

a second filter module that passes signals in a second frequency band; and a third filter module that passes signals in a third frequency band, wherein the first, second, and third filter modules are connected in parallel with each other, the second and third filter modules form a parallel resonant circuit for signals in the first frequency band, the first and third filter modules form a parallel resonant circuit for signals in the second frequency band, and the first and second filter modules form a parallel resonant circuit for signals in the third frequency band, wherein each of the filter modules includes a filter and a phase shifter provided at a front stage of the filter, wherein when a pass frequency of a filter in the first filter module is f1, a pass frequency of a filter in the second filter module is f2, and a pass frequency of a filter in the third filter module is f3, phase components of reflection coefficients at the pass frequencies f1, f2, and f3 in the filter modules satisfy the following conditions:

$\theta_2(f1)+\theta_3(f1)=2n_1\pi+2[\alpha_2(f1)+\alpha_3(f1)]$ and $\theta_2(f1)\neq(2p_1-1)\pi+2\alpha_2(f1)$, $\theta_3(f1)\neq(2m_1-1)\pi+2\alpha_3(f1)$  (B1)

$\theta_3(f2)+\theta_1(f2)=2n_2\pi+2[\alpha_3(f2)+\alpha_1(f2)]$ and $\theta_3(f2)\neq(2p_2-1)\pi+2\alpha_3(f2)$, $\theta_1(f2)\neq(2m_2-1)\pi+2\alpha_1(f2)$  (B2)

$\theta_1(f3)+\theta_2(f3)=2n_3\pi+2[\alpha_1(f3)+\alpha_2(f3)]$ and $\theta_1(f3)\neq(2p_3-1)\pi+2\alpha_1(f3)$, $\theta_2(f3)\neq(2m_3-1)\pi+2\alpha_2(f3)$  (B3)

where $\theta_i(f1)$: phase of a reflection coefficient at the frequency f1 in the filter of the i-th (=1, 2, 3) filter module, $\theta_i(f2)$: phase of a reflection coefficient at the frequency f2 in the filter of the i-th filter module, $\theta_i(f3)$: phase of a reflection coefficient at the frequency f3 in the filter of the i-th filter module, $\alpha_i(f1)$: phase characteristic at the frequency f1 in the phase shifter of the i-th filter module, $\alpha_i(f2)$: phase characteristic at the frequency f2 in the phase shifter of the i-th filter module, $\alpha_i(f3)$: phase characteristic at the frequency f3 in the phase shifter of the i-th filter module, $n_1, n_2, n_3, m_1, m_2, m_3, p_1, p_2, p_3$: arbitrary integers.

3. A triplexer circuit for separating an input signal into signals in three frequency bands which are different from each other, comprising:

a first filter module that passes signals in a first frequency band;

a second filter module that passes signals in a second frequency band; and a third filter module that passes signals in a third frequency band, wherein the first, second, and third filter modules are connected in parallel with each other, the second and third filter modules form a parallel resonant circuit for signals in the first frequency band, the first and third filter modules form a parallel resonant circuit for signals in the second frequency band, and the first and second filter modules form a parallel resonant circuit for signals in the third frequency band, wherein each of the filter modules includes a filter and a phase shifter provided at a front stage of the filter, wherein the phase shifter is a transmission line and, when a pass frequency of a filter in the first filter module is f1, a pass frequency of a filter in the second filter module is f2, and a pass frequency of a filter in the third filter module is f3, physical lengths $l_1$, $l_2$, and $l_3$ of transmission lines in the filter modules satisfy the following conditions:

$$\ell_1 = \frac{c}{2\pi\sqrt{\varepsilon_{r1}\mu_{r1}}}\left\{-\frac{\theta_2(f1)+\theta_3(f1)-2n_1\pi}{4f1}+\frac{\theta_3(f2)+\theta_1(f2)-2n_2\pi}{4f2}+\frac{\theta_1(f3)+\theta_2(f3)-2n_3\pi}{4f3}\right\} \quad (C1)$$

$$\ell_1 \neq \frac{c\{\theta_1(f2)-(2p_1-1)\pi\}}{4\pi\sqrt{\varepsilon_{r1}\mu_{r1}}\,f2}, \quad \ell_1 \neq \frac{c\{\theta_1(f3)-(2m_1-1)\pi\}}{4\pi\sqrt{\varepsilon_{r1}\mu_{r1}}\,f3}$$

$$\ell_2 = \frac{c}{2\pi\sqrt{\varepsilon_{r2}\mu_{r2}}}\left\{\frac{\theta_2(f1)+\theta_3(f1)-2n_1\pi}{4f1}-\frac{\theta_3(f2)+\theta_1(f2)-2n_2\pi}{4f2}+\frac{\theta_1(f3)+\theta_2(f3)-2n_3\pi}{4f3}\right\} \quad (C2)$$

$$\ell_2 \neq \frac{c\{\theta_1(f1)-(2p_2-1)\pi\}}{4\pi\sqrt{\varepsilon_{r2}\mu_{r2}}\,f1}, \quad \ell_2 \neq \frac{c\{\theta_2(f3)-(2m_2-1)\pi\}}{4\pi\sqrt{\varepsilon_{r2}\mu_{r2}}\,f3}$$

$$\ell_3 = \frac{c}{2\pi\sqrt{\varepsilon_{r3}\mu_{r3}}}\left\{\frac{\theta_2(f1)+\theta_3(f1)-2n_1\pi}{4f1}+\frac{\theta_3(f2)+\theta_1(f2)-2n_2\pi}{4f2}-\frac{\theta_1(f3)+\theta_2(f3)-2n_3\pi}{4f3}\right\} \quad (C3)$$

$$\ell_3 \neq \frac{c\{\theta_1(f1)-(2p_3-1)\pi\}}{4\pi\sqrt{\varepsilon_{r3}\mu_{r3}}\,f1}, \quad \ell_3 \neq \frac{c\{\theta_3(f2)-(2m_3-1)\pi\}}{4\pi\sqrt{\varepsilon_{r3}\mu_{r3}}\,f2}$$

where $\theta_i(f1)$: phase of a reflection coefficient at the frequency f1 in the filter of the i-th (=1, 2, 3) filter module, $\theta_i(f2)$: phase of a reflection coefficient at the frequency f2 in the filter of the i-th filter module, $\theta_i(f3)$: phase of a reflection coefficient at the frequency f3 in the filter of the i-th filter module, c: light velocity, $\varepsilon_{ri}$: relative permittivity of a transmission line of the i-th filter module, $\mu_{ri}$: relative magnetic permeability of the transmission line of the i-th filter module, $n_1, n_2, n_3, m_1, m_2, m_3, p_1, p_2, p_3$: arbitrary integers satisfying $l_1, l_2,$ and $l_3 \geq 0$ (where $l_1, l_2,$ and $l_3$ are not simultaneously) zero.

* * * * *